United States Patent
Narr et al.

(10) Patent No.: US 8,521,494 B2
(45) Date of Patent: Aug. 27, 2013

(54) SYSTEM AND METHOD FOR CHARACTERIZING FRACTURES IN A SUBSURFACE RESERVOIR

(75) Inventors: Wayne Narr, San Ramon, CA (US); Benjamin Todd Hoffman, Seattle, WA (US); Liyong Li, Livermore, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 686 days.

(21) Appl. No.: 12/730,909

(22) Filed: Mar. 24, 2010

(65) Prior Publication Data

US 2010/0250216 A1 Sep. 30, 2010

Related U.S. Application Data

(60) Provisional application No. 61/162,962, filed on Mar. 24, 2009.

(51) Int. Cl.
  G06G 7/48 (2006.01)
  G06G 7/50 (2006.01)
  E21B 49/00 (2006.01)
  G01V 11/00 (2006.01)

(52) U.S. Cl.
  CPC .............. *E21B 49/00* (2013.01); *G01V 11/00* (2013.01)
  USPC ..................... 703/10; 703/9; 702/6

(58) Field of Classification Search
  USPC ........................... 703/9–10; 702/6
  See application file for complete search history.

(56) References Cited

U.S. PATENT DOCUMENTS

| | | | |
|---|---|---|---|
| 4,907,442 A | 3/1990 | Jones et al. | |
| 5,661,698 A | 8/1997 | Cacas | |
| 5,996,726 A | 12/1999 | Sorrells et al. | |
| 6,023,656 A | 2/2000 | Cacas et al. | |
| 6,064,944 A | 5/2000 | Sarda et al. | |
| 6,094,619 A | 7/2000 | Noetinger et al. | |
| 6,795,773 B2 | 9/2004 | Soliman et al. | |
| 6,842,725 B1 | 1/2005 | Sarda | |
| 6,922,662 B2 | 7/2005 | Manceau et al. | |
| 7,565,278 B2 | 7/2009 | Li et al. | |
| 8,244,509 B2 * | 8/2012 | Banerjee et al. ............... | 703/9 |
| 2002/0013687 A1 | 1/2002 | Ortoleva | |

(Continued)

OTHER PUBLICATIONS

Sarkar et al. "Fluid Flow Modeling in Fractures". http://dspace.mit.edu/bitstream/handle/1721.1/68616/SARKAR.pdf?sequence=1. 2004., 41 Pages.*

(Continued)

*Primary Examiner* — Eunhee Kim
(74) *Attorney, Agent, or Firm* — Craig R. Vander Ploeg; Christopher D. Northcutt

(57) ABSTRACT

The disclosed methods, systems, and software are described to optimize fracture characteristics and simulate fluid flow rates in a well model. The well model, which includes at least one fracture intersecting a production well, is generated with static and dynamic data. Fluid flow in the well model is simulated to obtain simulated fluid flow rates between fractures and the well. Fracture properties, such as length, height and aperture, are then updated responsive to measured and simulated fluid flow rates. Multiple simulation runs and updating of the fracture properties can be performed until the simulated fluid flow rates converge with the measured fluid flow rates. Pressure data can be used to determine gridblock permeability, which in turn helps constrain the model, thus providing more reliable fracture properties. Uncertainty ranges of the fracture properties can also be calculated.

21 Claims, 13 Drawing Sheets

(56) References Cited

U.S. PATENT DOCUMENTS

| | | |
|---|---|---|
| 2002/0053430 A1 | 5/2002 | Curtis et al. |
| 2006/0015310 A1 | 1/2006 | Husen et al. |
| 2006/0224370 A1* | 10/2006 | Siebrits et al. ............... 703/10 |
| 2007/0016389 A1 | 1/2007 | Ozgen |
| 2008/0091396 A1 | 4/2008 | Kennon et al. |
| 2008/0133186 A1 | 6/2008 | Li et al. |
| 2008/0255816 A1 | 10/2008 | Neville |

OTHER PUBLICATIONS

Berkowitz, B.; Characterizing flow and transport in fractured geological media: Advances in Water Resources, Aug.-Dec. 2002, vol. 25, Issues 8-12, pp. 861-884.

Transmittal of International Preliminary Report on Patentability and Written Opinion from International Application No. PCT/US2010/028513, Oct. 6, 2011, 5 pages.

Dershowitz, B.; LaPointe, P.; Eiben, T.; and Wei, L. "Integration of Discrete Feature Network Methods with Conventional Simulator Approaches." SPE Reservoir Eval. & Eng., vol. 3, 2, 1 No. 2 SPE 62498-PA, pp. 165-170, Apr. 2000.

Hui, M,H.; Kamath, J.; Narr, W.; Gong, B.; and Fitzmorris R. Realistic Modeling of Fracture Networks in a Giant Carbonate Reservoir. IPTC 11386, presented at the International Petroleum Technology Conference, Dubai, U.A.E., pp. 1-11, Dec. 2007.

Karimi-Fard, M.; Durlofsky, L.J.; and Aziz, K. "An Efficient Discrete-Fracture Model Applicable for General-Purpose Reservoir Simulators." SPE Journal, vol. 9, No. 2, SPE 88812-PA, pp. 227-236, Jun. 2004.

Lee, S.H.; Jensen, C.L.; and Lough, M. F. "An Efficient Finite Difference Model for Flow in a Reservoir with Multiple Length-Scale Fractures." Paper SPE 56752, presented at SPE Annual Technical Conference & Exhibition, Houston, Texas, pp. 1-11, Oct. 1999.

Lee, S.H.; Lough, M. F.; and Jensen, C.L. "Hierarchical Modeling of Flow in Naturally Fractured Formations with Multiple Length Scales", Water Resources Research, pp. 37, 443-455, 2001.

Li, L.; and Lee, S.H. "Efficient Field-Scale Simulation of Black Oil in a Naturally Fractured Reservoir through Discrete Fracture Networks and Homogenized Media." SPE Reservoir Eval. & Eng., vol. 11, No. 4, SPE 103901-PA, pp. 750-758, Aug. 2008.

Lough, M. F.; Lee, S.H.; Kamath, J. "An Efficient Boundary Integral Formulation for Flow through Fractured Porous Media." Journal of Computational Physics, vol. 143, Issue 2, Article No. CP985858, pp. 462-483, Jul. 1998.

Sarda, S.; Jeannin, L; and Bourbiaux, B. "Hydraulic Characterization of Fractured Reservoirs: Simulation on Discrete Fracture Models." Paper SPE 66398, presented at SPE Reservoir Simulation Symposium, Houston, Texas, pp. 1-12, Feb. 2001.

* cited by examiner

SYSTEM AND METHOD FOR CHARACTERIZING FRACTURES IN A SUBSURFACE RESERVOIR

CROSS-REFERENCE TO RELATED APPLICATION

The present application for patent claims the benefit of U.S. Provisional Application for Patent bearing Ser. No. 61/162,962, filed on Mar. 24, 2009, the entirety of the application is incorporated herein by reference.

FIELD OF THE INVENTION

The present invention relates in general to methods, systems, and software for simulating fluid flow and characterizing fractures in a subsurface reservoir, and in particular to methods, systems, and software that utilize dynamic production data to accurately determine fracture properties and predict fluid flow within the subsurface reservoir.

BACKGROUND OF THE INVENTION

The field of hydrocarbon production is directed to retrieving hydrocarbons that are trapped in subsurface reservoirs. These hydrocarbons can be recovered by drilling wells into the reservoirs such that hydrocarbons are able to flow from the reservoirs into the wells and up to the surface. The geology of a reservoir has a large impact on the production rate at which hydrocarbons are able to flow into a well. A large amount of effort has therefore, been dedicated to developing reservoir characterization and simulation techniques to better predict how fluid will flow within a reservoir.

Highly complex geological subsurface reservoirs, such as fractured reservoirs, present unique and specialized challenges with regards to forecasting fluid flow. A fractured reservoir is a reservoir in which a network of fractures enhances the permeability field, thereby significantly affecting well productivity and recovery efficiency. Fractures can be described as open cracks or voids embedded within the rock matrix, and can either be naturally occurring or artificially generated from a wellbore. Natural fractures typically occur in sets of parallel fractures that can range several orders of magnitude in size. The length distribution within a fracture set is characteristically non-linear, with many short fractures and a diminishing number of large fractures. The range of fracture apertures, which can be considered as the width of the fracture, is distributed in a similar manner. Furthermore, several fracture sets can coexist in a rock forming connected networks of significant extent and complexity.

FIG. 1 shows a schematic illustrating a physical geologic volume of a fractured reservoir 10 having a plurality of strata 11. The plurality of strata 11 are typically composed of parallel layers of rock and fluid material each characterized by different sedimentological and fluid properties. Fractures or fracture networks 13 are embedded within the rock matrix 15 and can play an important role in allowing fluids to flow through the reservoir to reach a well. For example, fracture network 13 often produces fluid to a intersecting production well at a rate that greatly exceeds the rate of flow from the rock matrix 15 to the well, as the fracture network 13 typically has a much greater capability to transport fluids. Accordingly, a network of multiple intersecting fractures often forms the basis for flow in fractured reservoirs.

Fracture representations, which are often utilized in reservoir modeling to represent a network of fractures within a subsurface reservoir, can be generated to accurately predict reservoir fluid flow characteristics. One method of generating a fracture representation includes progressing from observations of discrete fractures that intersect wellbores to a field-wide bulk distribution of fractures. Borehole image (BHI) logs make detailed images of the walls of a wellbore using resistivity or ultrasonic acoustic measurements. These images are used to determine the location, orientation, and aperture (width) of fractures intersected by the wellbore. Thus, a BHI log may show the total population of fractures that intersect a well. Additional data describing fractures intersecting a particular well can be obtained from sources such as cores, drilling information, production logs, and down-hole well measurements such as a temperature survey. This empirical data can be used to judge whether a particular fracture possesses the size and connectivity to affect fluid flow to a wellbore by a sufficient amount. The data associated with fractures that sufficiently affect fluid flow can be used to assemble logs of fracture density, which can be described as the fracture surface area per unit volume.

Artificial neural network techniques can be employed to generate a spatial distribution of fracture density. Such techniques are well known by those skilled in the art and allow for distribution of the fracture density using regression analysis based on the data describing the fractures. The fracture density can be resealed to match the observed distribution of fracture density at the wells and throughout the reservoir by using additional geostatistical techniques. For instance, neural network results can be re-scaled using Sequential Gaussian Simulation (SGS) collocated co-kriging, a technique well known in the art, wherein the neural network fracture density distribution is used as highly-correlated soft data. The resealed fracture density distribution can then be used to stochastically generate a fracture representation describing the network of fractures within the reservoir. In particular, the resealed fracture density distribution can be used as a constraint during the stochastic generation of the fracture representation. Fracture dimensions and orientation data can also be used to constrain the fracture representation.

There are many commercially available products for constructing fracture representations in this manner, such as FracMan™ distributed by Golder Associates Inc. headquartered in Atlanta, Ga. The stochastic fracture representation can be imported into a geological reservoir model to construct a more realistic geological characterization of a fractured subsurface reservoir. These realistic geological reservoir models are typically in the form of highly-resolved discrete fracture models (DFMs) that explicitly define each fracture.

FIG. 2 illustrates a fractured subsurface reservoir domain 20 having fracture representation 21. In this example, domain 20 contains forty (40) discrete fractures 23 that are represented by 2D polygons. While discrete fractures 23 within fracture representation 21 are represented as planar rectangles extending within domain 20, one skilled in the art will appreciate that discrete fractures 23 could be represented by other 2D or 3D geometric shapes. Discrete fractures 23 can extend within domain 20 such that they do not penetrate other discrete fractures 23, such as discrete fracture 25. However, as previously discussed, discrete fractures 23 often intersect one another forming connected networks of fractures of significant extent and complexity, such as fracture network 27.

While fracture representations define each fracture, the fractures intersecting the well are typically only constrained by its appearance in a conventional core, image log, or other borehole data. Therefore, while these fracture representations can estimate some of the fracture network parameters, the effective size (length and height) of a fracture away from the well remains a major unknown. This can contribute to considerable well-to-well production variability and makes performance predictions highly uncertain for fractured reservoirs.

SUMMARY

According to an aspect of the present invention, a method is disclosed for simulating fluid flow rates in a subsurface reservoir. The method includes the step of providing static and dynamic data for a production well in a subsurface reservoir that intersects at least one fracture. The dynamic data includes measured fluid flow rates from the fracture or fractures into the production well. A well model defining properties of the one or more fractures intersecting the production well is generated using the static and dynamic data. Fluid flow is simulated in the well model to obtain simulated fluid flow rates between the one or more fractures and the production well. Fracture properties defined in the well model are adjusted based on the simulated fluid flow rates and the measured fluid flow rates from the one or more fractures into the well. For example, the fracture properties can be optimized utilizing a genetic algorithm, simulated annealing, stochastic perturbation methods, or a combination thereof. Fluid flow in the updated well model having the adjusted fracture properties is simulated to obtain updated simulated fluid flow rates, which can be output or displayed. For example, the updated simulated fluid flow rates can be sent to a user interface device, a monitor, a computer readable storage medium, a local computer, or a computer that is part of a network.

In some embodiments, the steps of simulating fluid flow in the well model and updating properties of the fracture can be repeated until one or more predetermined criteria are satisfied. For example, the predetermined criteria can include repeating the steps of simulating fluid flow in the well model and updating properties of the fracture for a predetermined number of iterations, the updated simulated fluid flow rates matching the measured fluid flow rates, the updated simulated fluid flow rates being relatively stagnant for a successive number of iterations, or the updated simulated fluid flow rates not converging to within tolerances of the measured fluid flow rates within a predetermined number of iterations.

In some embodiments, the properties of the fractures can include lengths, heights, apertures, or a combination thereof. For example, a fracture's length can be adjusted by multiplying the length of the fracture by a ratio of a measured flow rate to a simulated flow rate for that fracture. In some embodiments, the ratio of the measured flow rate to the simulated flow rate is raised to a power of an exponent. In another example, a fracture's height or aperture can be adjusted proportional to a length of the fracture or adjusted proportional to the length of the fracture up to a predetermined maximum amount.

In some embodiments, the well model is associated with a grid defining gridblocks and the simulated fluid flow rate from each of the fractures into the well is calculated by a summation of the fluid flow that is within each of the gridblocks adjacent to the well that intersects the fracture. When two or more fractures intersect a gridblock adjacent to the well, the fluid flow within that gridblock can be divided between the fractures based on each of the fractures proportion of height within the gridblock.

According to another aspect of the present invention, a method is disclosed for optimizing fracture characteristics within a reservoir model of a subsurface reservoir. In particular, the method is related to a fractured subsurface reservoir in which a production well is intersected by at least one fracture. A reservoir model representative of the subsurface reservoir is provided that models the production well and intersecting fractures. Dynamic production data is also provided from the production well and includes measured fluid flow rates from the intersecting fracture or fractures into the production well. Fluid flow is simulated in the reservoir model to obtain simulated fluid flow rates between the one or more fractures and the production well. Fracture properties defined in the reservoir model are then adjusted based on the simulated fluid flow rates and the measured fluid flow rates from the one or more fractures into the well.

In some embodiments, the reservoir model having the adjusted fracture properties are output to a user interface device, a monitor, a computer readable storage medium, a local computer, or a computer that is part of a network.

In some embodiments, the reservoir model is optimized by utilizing a genetic algorithm, simulated annealing, stochastic perturbation methods, or a combination thereof, to adjust the fracture properties defined in the reservoir model.

In some embodiments, the steps of simulating the fluid flow in the reservoir model and adjusting properties of the fracture defined in the reservoir model are repeated until one or more predetermined criteria are satisfied. For example, the predetermined criteria can include repeating the steps of simulating fluid flow in the reservoir model and adjusting properties of the fracture defined in the reservoir model for a predetermined number of iterations. In another example, these steps can be repeated until the updated simulated fluid flow rates match the measured fluid flow rates. In another example, these steps can be repeated until the updated simulated fluid flow rates are relatively stagnant for a successive number of iterations. In another example, the steps are only repeated for a predetermined number of iterations if the updated simulated fluid flow rates do not converge within tolerances of the measured fluid flow rates.

In some embodiments, the fracture properties include lengths, heights, apertures, or a combination thereof. A fracture's length can be adjusted by multiplying the length of the fracture by a respective ratio of a measured flow rate to a simulated flow rate. In some embodiments, the ratio of the measured flow rate to the simulated flow rate is raised to a power of an exponent. In another example, a fracture's height, aperture, or height and aperture, can be adjusted proportional to a fracture's length or proportional to a fracture's length up to predetermined maximum amounts.

In some embodiments, the reservoir model is associated with a grid defining gridblocks and the simulated fluid flow rate from each of the fractures into the production well is calculated by a summation of the fluid flow that is within each of the gridblocks adjacent to the production well that intersects the fracture. When two or more fractures intersect a gridblock adjacent to the production well, the fluid flow within that gridblock can be divided between the fractures based on each of the fractures proportion of height within the gridblock.

Another aspect of the present invention includes a system to optimize fracture characteristics within a well model representative of a production well in a fractured subsurface reservoir. The system includes a computer processor, a database, and a software program. The database is used to store well models and associated well information, which can include simulation input data, parameter data, fracture data, and simulation output data. The software program is executable on a computer processor and includes a fracture adjustment module. The fracture adjustment module generates fracture data that defines one or more properties of a fracture intersecting the production well based on the parameter data. The fracture adjustment module can communicate with a flow simulation module of a reservoir simulator to simulate fluid flow in the well model and output the simulation output data. The fracture adjustment module updates fracture properties within the fracture data based on the simulation output data, such as a simulated fluid flow rate from the fracture into the production well.

In some embodiments, the fracture properties defined by the fracture data that undergo adjustment include length, height, aperture, or a combination thereof, for each fracture. For example, the fracture adjustment module can update fracture properties based on a ratio of a measured fluid flow rate from the fracture into the well, which is included in the parameter data, to a simulated fluid flow rate from the fracture into the production well, which is included in the simulation output data.

In some embodiments, the software program includes a permeability adjustment module to adjust gridblock permeability within the well model. The gridblock permeability can be adjusted by ensuring a calculated pressure of the simulated fluid flow in the well model is within a predetermined tolerance of a pressure provided in the parameter data.

In some embodiments, the software program includes an uncertainty module that changes parameters within the parameter file, is adapted to communicate with the flow simulation module of the reservoir simulator to initiate simulation using the changed parameters, and generates a measure of uncertainty for the parameters based on simulation output data from the flow simulation module.

Another aspect of the present invention includes a software program that is stored on a processor readable medium to optimize fracture characteristics within a reservoir model of a subsurface reservoir. The software program includes a fracture adjustment module that generates and optimizes a fracture representation for a reservoir model. In particular, the fracture adjustment module generates a fracture representation for a reservoir model including fractures intersecting a production well in a subsurface reservoir. The fracture adjustment module communicates with a flow simulation module of a reservoir simulator to simulate fluid flow in the reservoir model and output the simulation output data. The fracture adjustment module optimizes the fracture representation by adjusting fracture properties based on the simulation output data, such as a simulated fluid flow rate from the fracture into the production well.

In some embodiments, fracture properties defined by the fracture representation that undergo adjustment include length, height, aperture, or a combination thereof. For example, the fracture adjustment module can update fracture properties based on a ratio of a measured fluid flow rate from the fracture into the well to the simulated fluid flow rate from the fracture into the production well output in the simulation output data.

In some embodiments, the software program includes a permeability adjustment module to adjust gridblock permeability within the reservoir model. The gridblock permeability can be adjusted by ensuring a calculated pressure of the simulated, fluid flow in the reservoir model is within a predetermined tolerance of a measured pressure from the fracture into the well.

In some embodiments, the software program includes an uncertainty module that changes parameters within the reservoir model, is adapted to communicate with the flow simulation module of the reservoir simulator to initiate simulation using the changed parameters, and generates a measure of uncertainty for the parameters based on simulation output from the flow simulation module.

DETAILED DESCRIPTION

Embodiments of the present methods, systems, and software described herein are generally directed to estimating the effective dimensions of fractures intersected by a wellbore in a reservoir field. In particular, this system and method utilize a synthesis of conventional static and dynamic borehole measurements, plus newly developed software tools, to help ascertain size dimensions of open, fluid-conductive fractures in a reservoir. As will be discussed herein, this includes the fractures true lengths and heights, which can extend a great distance beyond where they intersect with the wellbore. The term "effective dimensions of fractures," as used herein, therefore refers to an approximate size of the connected network of fractures, as fractures intersecting the borehole wall may be connected to other fractures in the reservoir. Knowledge of effective dimensions of fractures can be used to estimate potential for fracture interconnectivity among wells in a field, reservoir drainage patterns, and implications of injection and production patterns, all of which can impact reservoir management decisions. Furthermore, fracture size distributions can be used as an input for flow-simulation modeling, thus providing an improved physical basis for overall reservoir performance predictions.

Figure 1:
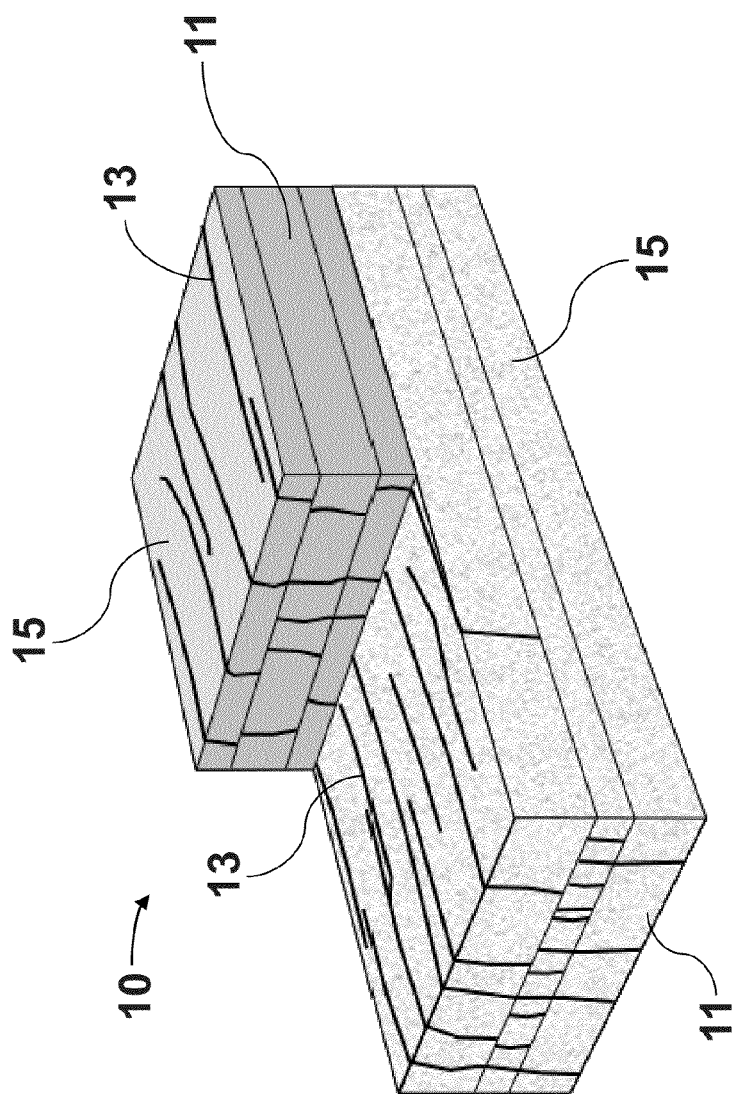
FIG. 1 is a schematic view of a fractured subsurface reservoir.
Figure 2:
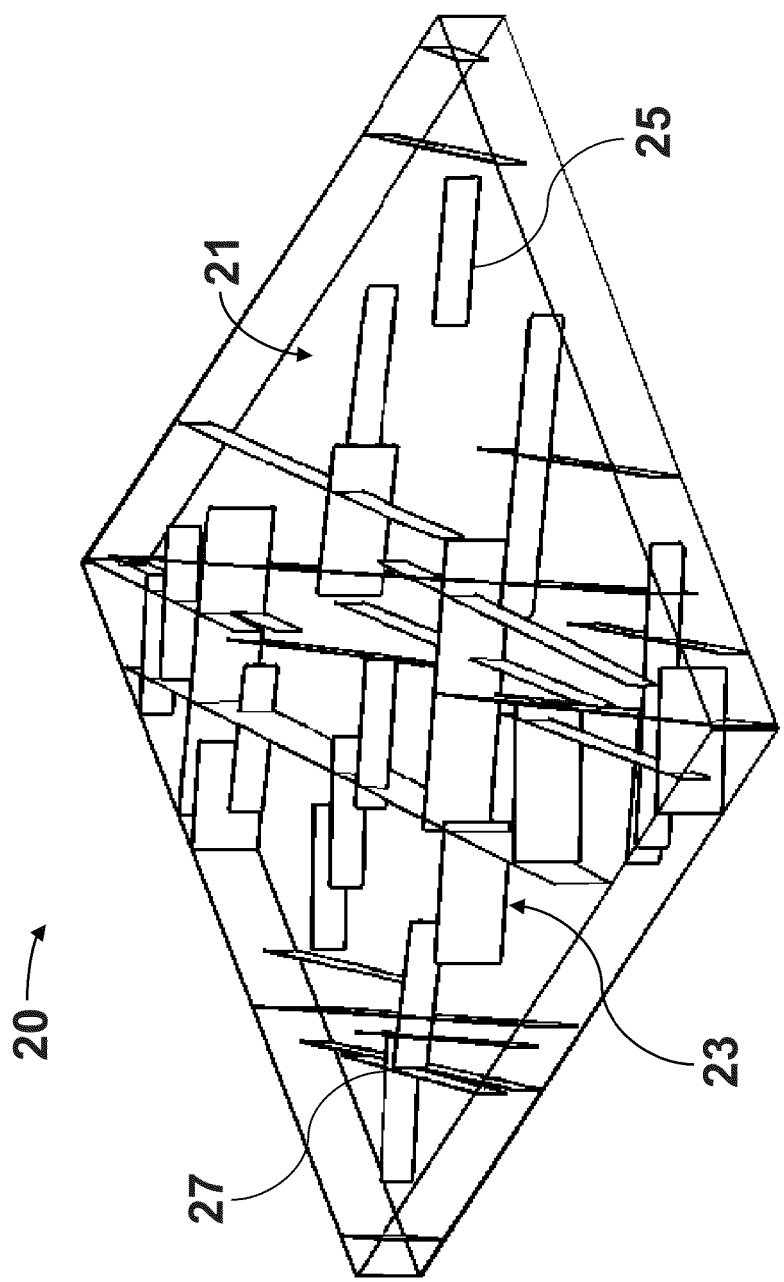
FIG. 2 is a schematic view of a fracture representation for a fractured subsurface reservoir.
Figure 3:
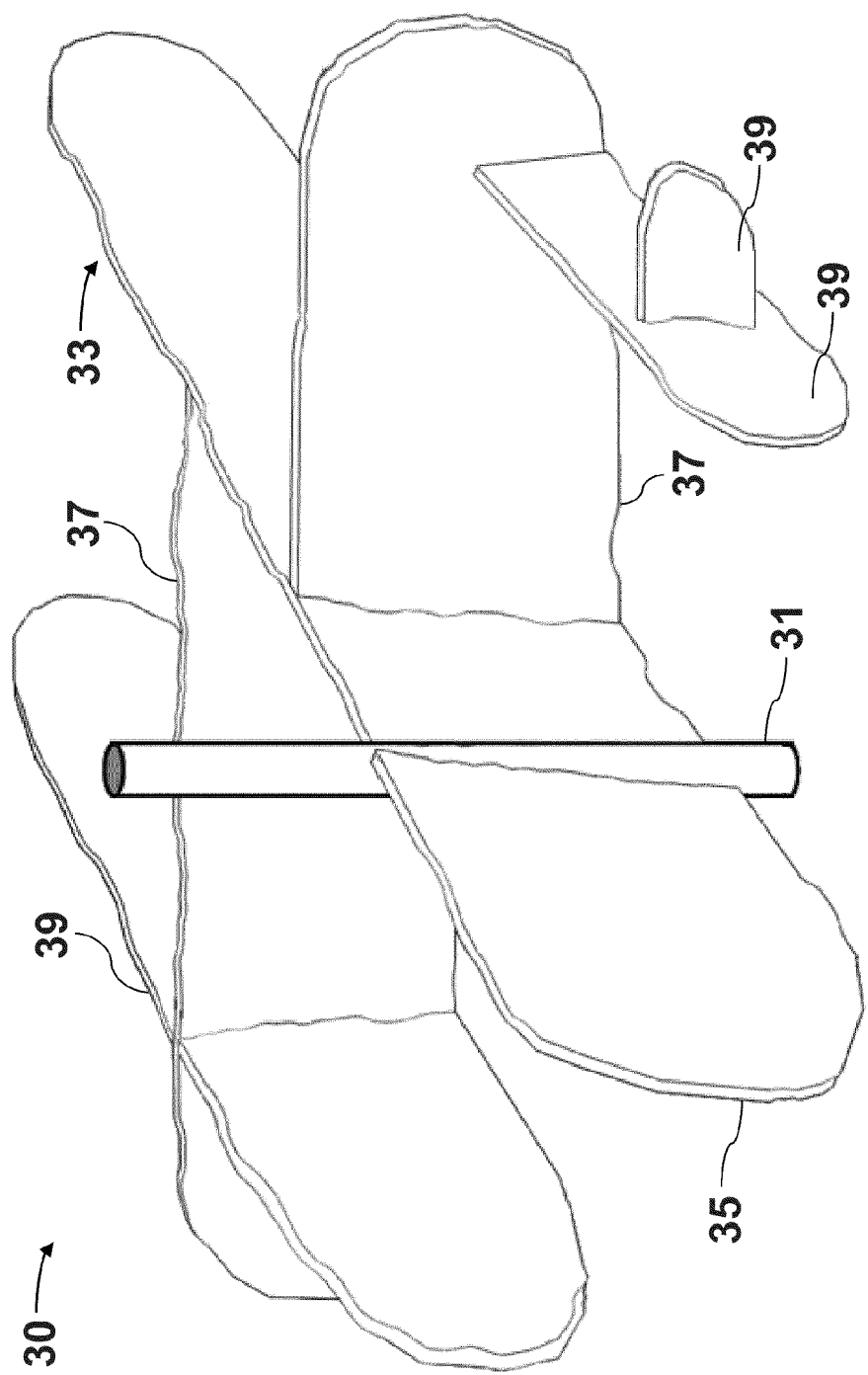
FIG. 3 is a schematic diagram of a reservoir having a wellbore that intersects a connected fracture network, in accordance with aspects of the present invention.

FIG. 3 illustrates a subsurface reservoir 30 that contains a wellbore 31 that is intersected by a connected fracture network 33. Fracture network includes fracture 35 that directly intersects wellbore 31, fractures 37 that directly connect to fracture 35, and fractures 39 that indirectly connect to fracture 35, such as through fractures 37. Fractures 39 can also indirectly connect to fracture 35 through fractures 37 and other fluidly connected fractures 39. Therefore, while only fracture 35 is directly intersecting wellbore 31, the effective dimensions of fracture 35 takes into account the approximate size of the entire connected fracture network 33, as fracture 35 is in fluid communication with fractures 37 and 39.

Figure 4:
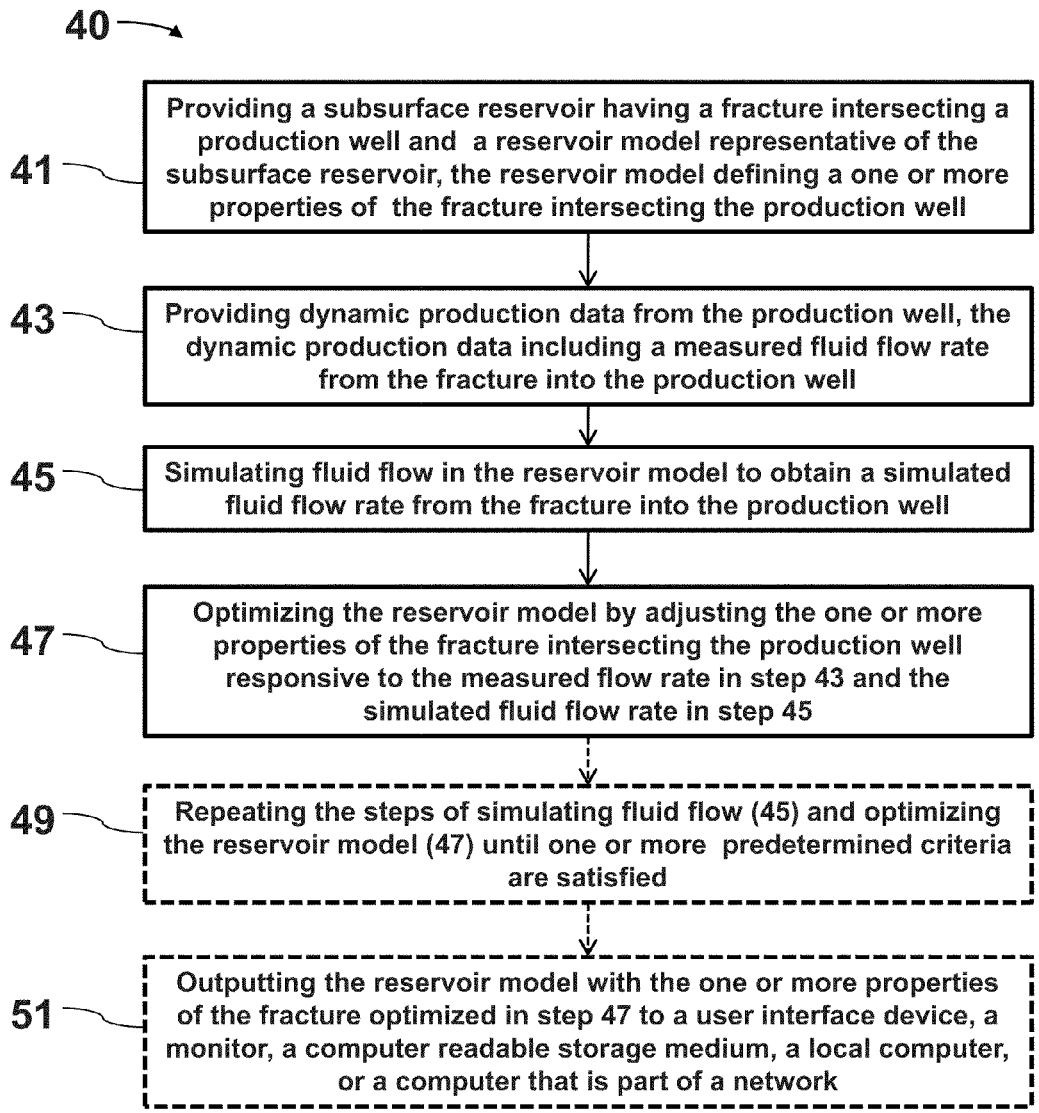
FIG. 4 is a flowchart illustrating steps of a fracture characterization method, in accordance with aspects of the present invention.

FIG. 4 illustrates the steps of method 40 for optimizing fracture characteristics in a subsurface reservoir. In step 41, a fractured subsurface reservoir and a reservoir model representative of a fractured subsurface reservoir is provided. In particular, the reservoir model models at least a production well and a fracture intersecting the production well in the fractured subsurface reservoir. In step 43, dynamic production data is provided for the production well including a measured fluid flow rate from the fracture into the production well. Step 45 includes simulating fluid flow in the well model to obtain a simulated fluid flow rate from the fracture into the well. Based on the measured flow rate and the simulated fluid flow rate, the reservoir model is optimized by adjusting properties of the fracture, such as fracture length or height. Therefore, fracture properties are conditioned to dynamic production data using method 40 such that the effective dimensions of fractures are accounted for in the reservoir model.

Some embodiments of method 40 additionally include steps 49 and 51, which are shown in dotted line in FIG. 4. In step 49, step 45 of simulating fluid flow and step 47 of optimizing the reservoir model are repeated until one or more predetermined criteria are satisfied. Examples of such predetermined criteria are described in greater detail later herein. In step 51, the reservoir model with the optimized fracture properties are output or displayed to a user interface device, a monitor, a computer readable storage medium, a local computer, or a computer that is part of a network.

Figure 5:
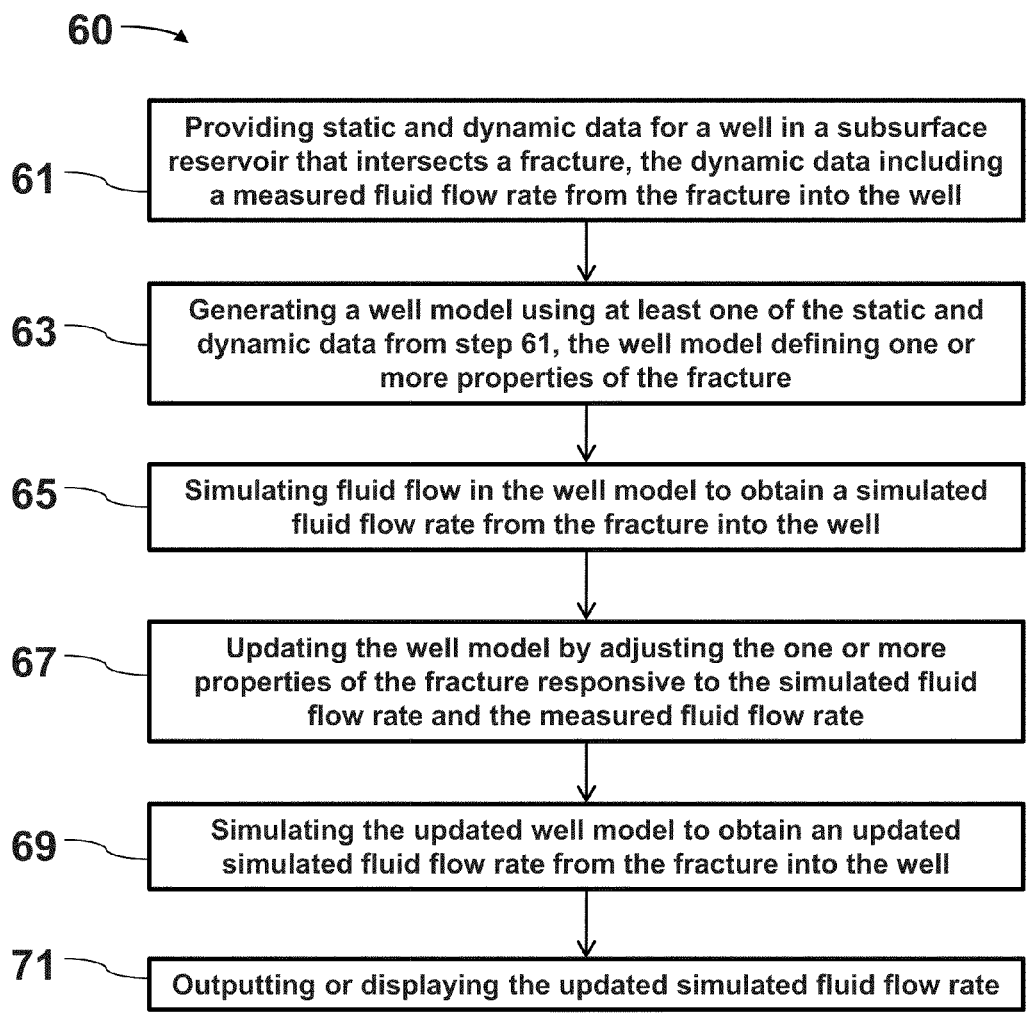
FIG. 5 is a flowchart illustrating steps of a simulation method to predict reservoir performance, in accordance with aspects of the present invention.

FIG. 5 illustrates the steps of method 60 for simulating fluid flow rates in a subsurface reservoir using optimized fracture properties. In step 61, static and dynamic data are provided for a well in a subsurface reservoir that intersects a fracture. The dynamic data includes measured fluid flow rates from the fracture into the well. A well model defining properties of the fracture, such as in a fracture representation, is generated in step 63 using the static and dynamic data. A fluid flow rate, from the fracture into the well, is then obtained in step 65 by simulating fluid flow in the well model. In step 67, the well model is updated by adjusting the properties of the fracture. The properties of the fracture are adjusted responsive to the simulated fluid flow rate and the measured fluid flow rates from the fracture into the well. Typically, the fracture properties that undergo adjustment include length, height, and aperture of the fractures. As will be described later herein, gridblock permeability can also be adjusted responsive to the simulated fluid flow rate and the measured fluid flow rates from the fracture into the well. In step 69, fluid flow is simulated using the updated well model having adjusted fracture properties. The simulated flow rate can be output or displayed in step 71. In some embodiments, the simulated fluid flow rate can be used to further refine the properties of the fracture, thus again updating fracture properties. As described in greater detail later herein, this process can be iteratively repeated until the simulated fluid flow rate satisfies a predetermined criteria. Therefore, using method 60 the effective dimensions of fractures are accounted for in the well model as fracture properties are conditioned to dynamic production data and the measured flow rates match the simulated flow rates.

Static data for a well that is used in methods 40, 60 is provided mainly from borehole image (BHI) logs and cores. One skilled in the art will appreciate that static data can also be provided from other sources, such as drilling information or seismic data. The dynamic data used in methods 40, 60 is typically provided from a production logging tool (PLT). This tool measures the flow rate of fluids into or out of the borehole as a function of the depth in the well and provides information about which fractures are productive, including how much is flowing from each one. Therefore, the production logging tool data can be used to identify which fractures are sufficiently extensive to flow at a substantial rate. In methods 40, 60, production logging tool information is used to estimate the effective size and other properties for fractures intersecting a single well. One skilled in the art will appreciate that dynamic data can also be provided from other sources, such as production logs and other down-hole well measurements.

Well models or fracture representations are provided in methods 40, 60 using the static and dynamic data. Fracture representations can be combined with a reservoir model and then used to accurately simulate fluid flow in a fractured reservoir. As described in the Background of the Invention, there are various methods known in the art of reservoir modeling for creating fracture representations. For example, Liyong Li et al. discloses a method of creating a three-dimensional hybrid reservoir model representative of a fractured subterranean reservoir in U.S. Pat. No. 7,565,278, "Method, System and Apparatus for Simulating Fluid Flow in a Fractured Reservoir Utilizing A Combination of Discrete Fracture Networks and Homogenization of Small Fractures" filed Dec. 4, 2006, which is incorporated herein by reference to the extent it does not contradict statements herein. The model includes a grid defining porous matrix blocks and a network of long fractures overlying the matrix blocks, which are modeled by two-dimensional fracture blocks. Small and medium fractures are preferably, although not required, modeled by effective permeability, which incorporates the permeability of the small and medium fractures into the permeability of the porous matrix blocks. Matrix and fracture flow equations, which are coupled via the effective fluid flow transmissibility, are then solved simultaneously to obtain flow information for fluids in the reservoir being modeled, such as pressures, saturations, temperatures, and flow rates.

In methods 40, 60, the fluid flow rates obtained through simulation are used to adjust the properties of the fracture, such as fracture size. In particular, the properties of the fracture are adjusted based on how the simulated fluid flow rate compares to the measured fluid flow rate included in the dynamic data, which is typically provided by a production logging tool. As will be described in greater detail later herein, if the simulated fluid flow rate is less than the measured fluid flow rate, the modeled fracture is typically increased in size. Similarly, if the simulated fluid flow rate is greater than the measured fluid flow rate, the modeled fracture is typically decreased in size. For example, the fracture properties that undergo refinement can include length, height, aperture of the fractures, or a combination thereof.

Simulation by a discrete fracture network flow simulator requires information on each fracture in the well model. This can include the x, y and z locations of the two end points of each fracture, as well as, its permeability and aperture. The fracture properties, such as size, are optimized using methods

40, 60 and the discrete fracture network flow simulator is used as the forward model. The single well flow model, which can either be extracted from a larger field model or created specifically for a project, is generated with the well of interest at the center of the model. Fractures that are known to intersect the well, which are obtained from the static and dynamic data, constrain the single well flow model. Fracture sizes, however, are generally not known, so methods 40, 60 are employed to adjust the fracture sizes until the simulated fluid flow rates from each fractured zone match the measured fluid flow rates. In some embodiments, the simulated fluid flow rates are considered to match the measured fluid flow rates if each simulated rate is within a predetermined tolerance of the measured fluid flow rate for the corresponding fractured zone. In some embodiments, the simulated fluid flow rates are considered to match the measured fluid flow rates if the total simulated fluid flow rates are within a predetermined tolerance of the total measured fluid flow rates. Methods 40, 60 therefore adjust fracture properties so that the fractures intersecting the well are characterized by their effective dimensions.

Optimization methods can be used to more efficiently optimize the properties of the fracture such that the simulated fluid flow rates match the measured fluid flow rates. Well known optimizing methods include genetic algorithms, simulated annealing, and stochastic perturbation methods. For example, the properties of the fracture can more efficiently be optimized utilizing a genetic algorithm. Here fracture properties such as fracture height, length, aperture, area, volume, or a combination thereof are selected to define an initial population of solutions. The initial population can cover the entire range of possible solutions or a range where optimal solutions are likely to be found. Typically each solution is evaluated or ranked using a fitness function and an optimal set of solutions is stochastically selected. The optimal set of solutions are then recombined or mutated to form a next generation of solutions. For instance, certain fracture properties from a first solution can be paired with certain fracture properties from a second solution to create a new "offspring" solution. The next generation of solutions is typically of better quality compared to the initial population of solutions because it is produced from more optimal solutions in the initial population. Selection and reproduction of optimal solutions in a generation can be iteratively repeated until a predetermined termination condition is reached. Predetermined termination criteria can include the simulated fluid flow rates being considered to match the measured fluid flow rates, a successive number of iterations no longer producing better results, a predetermined number of generations being reached, or a combination thereof.

Figure 6:
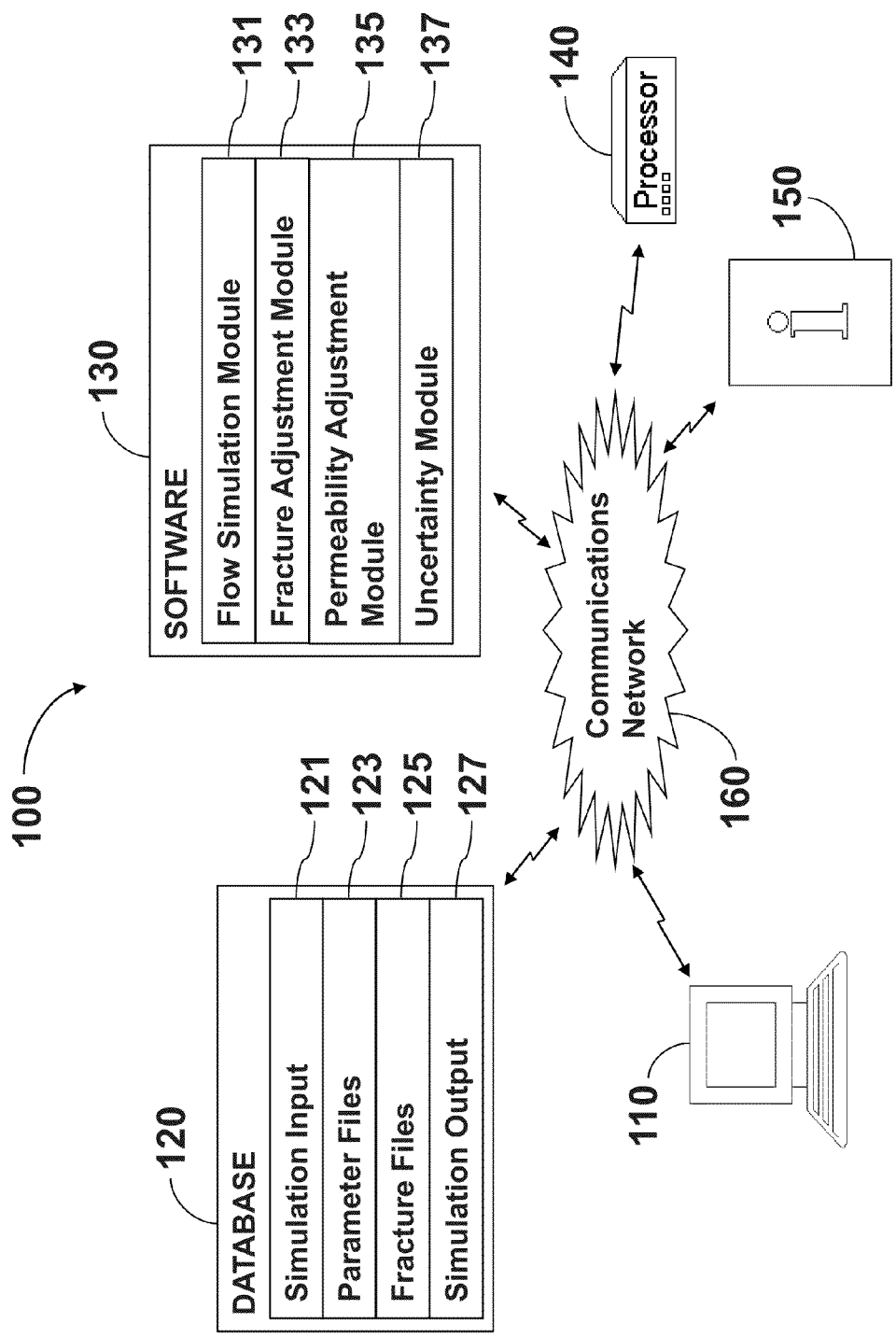
FIG. 6 is a schematic diagram of a system used for characterizing fractures, in accordance with aspects of the present invention.
Figure 7:
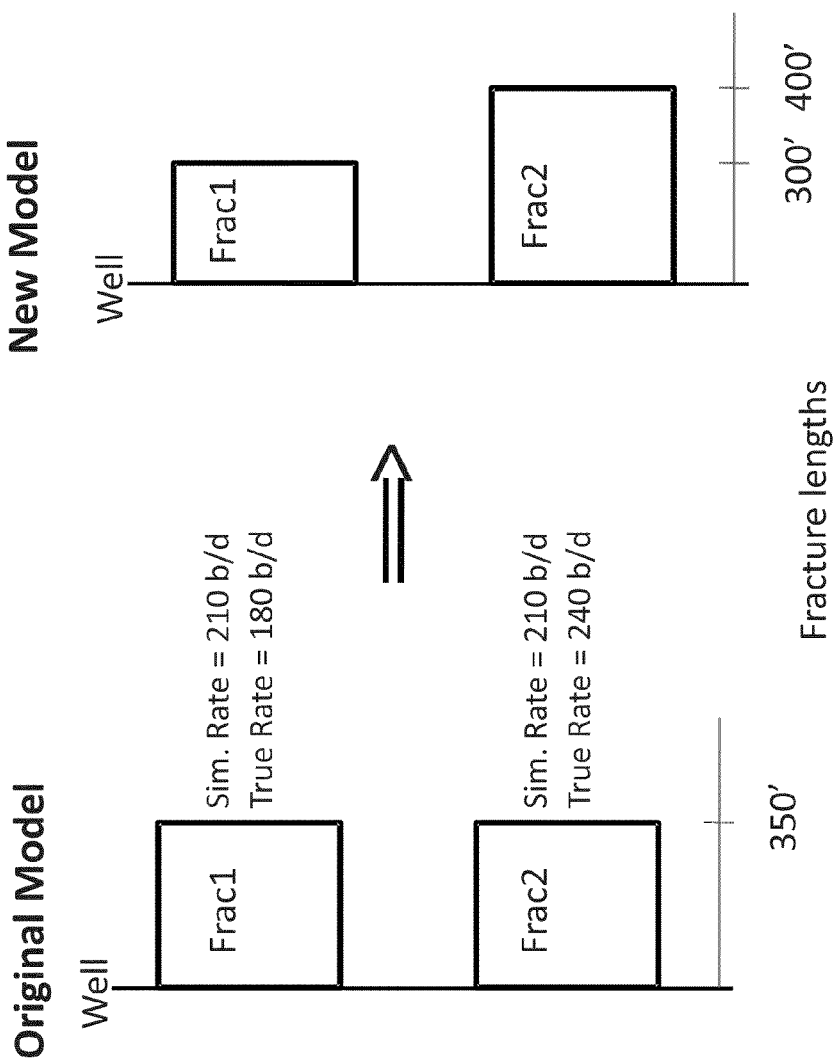
FIG. 7 is a schematic diagram showing fracture lengths being updated in a well model, in accordance with aspects of the present invention.

FIG. 6 illustrates a system 100 by which fracture characterizations for a subsurface reservoir are optimized. System 100 includes user interface 110, such that an operator can actively input information and review operations of system 100. User interface 110 can be anything by which a person is capable of interacting with system 100, which can include but is not limited to a keyboard, mouse, or touch-screen display. Input that is entered into system 100 through user interface 110 can be stored in a database 120. Additionally, any information generated by system 100 can also be stored in database 120. As described in more detail below, simulation input 121, parameter files 123, fracture files 125, and simulation output 127 are all examples of information that can be stored in database 120.

System 100 includes software 130 that is stored on a processor readable medium. Current examples of a processor readable medium include, but are not limited to, an electronic circuit, a semiconductor memory device, a ROM, a flash memory, an erasable programmable ROM (EPROM), a floppy diskette, a compact disk (CD-ROM), an optical disk, a hard disk, and a fiber optic medium. As will be described more fully herein, software 130 can include a plurality of modules for performing system tasks. Processor 140 interprets instructions to execute software 130 and generates automatic instructions to execute software for system 100 responsive to predetermined conditions. Instructions from both user interface 110 and software 130 are processed by processor 140 for operation of system 100. In some embodiments, a plurality of processors can be utilized such that system operations can be executed more rapidly.

Examples of modules for software 130 include, but are not limited to, flow simulation module 131, fracture adjustment module 133, permeability adjustment module 135, and uncertainty module 137. Furthermore, while flow simulation module 131, fracture adjustment module 133, permeability adjustment module 135, and uncertainty module 137 are all examples of modules for software 130, they need not be present in the same software package. For example, flow simulation module 131 could be a module in an external reservoir simulator (not shown in FIG. 6).

Flow simulation module 131 is capable of retrieving simulation input 121, parameter files 123, fracture files 125, or a combination thereof, from database 120, simulating fluid flow, and generating simulation output 127 indicative of the simulated fluid flow. Fracture adjustment module 133 is capable of adjusting fracture properties so that simulated fluid flow from each fractured zone converges with the measured field data. Accordingly, fracture adjustment module 133 determines the effective fracture dimensions for fractures intersecting the wellbore. This is done by retrieving parameter file 123, generating fracture file 125 responsive to parameter file 123, and updating fracture file 125 responsive to simulation output 127. Permeability adjustment module 135 is capable of adjusting gridblock permeability to a reasonable order of magnitude, such that the simulated pressure from each fractured zone matches pressure information in parameter file 123. Uncertainty module 137 is capable of changing parameters within parameter file 123, interacting with flow simulation module 131 to simulate the changed parameters, and generating a measure of uncertainty for the parameters responsive to simulation output 127.

In certain embodiments, system 100 can include reporting unit 150 to provide information to the operator or to other systems (not shown), such as an external reservoir simulator. For example, reporting unit 150 can be a printer, display screen, or a data storage device. However, it should be understood that system 100 need not include reporting unit 150, and alternatively user interface 110 can be utilized for reporting information of system 100 to the operator.

Communication between any components of system 100, such as user interface 110, database 120, software 130, processor 140 and reporting unit 150, as well as, communication with external systems (not shown) such as a reservoir simulator, can be transferred over a communications network 160. Communications network 160 can be any means that allows for information transfer. Examples of such a communications network 160 presently include, but are not limited to, a switch within a computer, a personal area network (PAN), a local area network (LAN), a wide area network (WAN), and a global area network (GAN). Communications network 160 can also include any hardware technology used to connect the individual devices in the network, such as an optical cable or wireless radio frequency.

In operation, system 100 is populated with simulation input 121, such as a simulation input deck, and parameter file 123, which includes fracture data and model properties. Parameter file 123 has information that typically includes the depth, orientation, height, and aperture or permeability of the fractures. As previously described, this data can come from borehole images, well test data, production logging tool data, or other sources. The measured flow rate from each fractured zone, which was observed using the production logging tool, is also typically included in the input parameter file 123. Additionally, the parameter file 123 can include some optional information such as convergence tolerance, different height and aperture options, average initial lengths, and when the production logging tool data was taken.

Once the parameter file 123 and flow simulation input 121 are populated into system 100, the files can be checked to ensure they are all compatible. For example, system 100 can check to make sure that the well is only completed in locations where flow rates are associated with fractures observed from the production logging tool data. System 100 can also ensure that the model is simulated for at least a time period that corresponds with the time period in which the production logging tool data was taken. If needed, system 100 can modify flow simulation input 121 such that it is compatible with all other files.

Fracture adjustment module 133 creates an initial text fracture file 125 that contains the location and aperture of the fractures for the first flow simulation run. Fracture adjustment module 133 can use a constant value for all the fracture sizes, or generate initial fracture estimates, which can save a few simulation iterations. The true or measured production rates from each fracture can be used to generate initial fracture sizes. For example, the initial fracture lengths can be calculated using the following equation:

$$\text{init\_len}(i) = \frac{1}{\text{n\_fracs} * \left[\frac{\text{true\_rate}(i)}{\text{well\_total\_rate}}\right]^2 * \text{average\_initial\_length}} \quad \text{(Equation 1)}$$

for i=1→n_fracs (total number of fractures)
Use of this calculation assures that the fractures having the lowest production rates start off with the shortest fractures, and the ones having the highest production rates start off with the longest fractures.

In addition to initial fracture lengths, the fracture file 125 can also include depth, height, aperture, and orientation of the fracture. This information, which comes from input parameter file 123, is used to determine the x, y and z locations of the two end points of the fracture. To get the x and y locations of each end point, half of the fracture length can be added to each side of the fracture center point. Similarly, to get the top and bottom z locations of the fracture, half of the fracture height is respectively added and subtracted to the fracture depth. Fracture permeability can also be calculated from the aperture using the following equation:

$$\text{frac\_perm} = \frac{\text{aperture}^2}{12} * 1.01325 \times 10^{15} \quad \text{(Equation 2)}$$

where $1.01325 \times 10^{15}$ is the constant to convert from aperture units of square meters (m$^2$) to permeability units of millidarcies (mD). All of this data can be used to create initial and subsequent text fracture files 125 that contain the fracture information for each fracture in the model. Once this has been completed, simulation of the model can be performed.

Flow simulation module 131, which performs discrete fracture network flow simulation, is used to perform fluid flow simulation of the well model. In particular, simulation typically includes solving governing nonlinear equations for unknowns such as pressure and saturation in the model gridblocks over many timesteps to simulate fluid flow in the reservoir. For example, flow simulation module 131 may use Newton's iteration method to solve the nonlinear equations. The nonlinear equations are constructed for each gridblock, generally in the form of finite difference equations, which are representative of properties of rocks and fluids in the reservoir. Examples of rock properties include porosity, capillary pressure, and relative permeability for each phase of fluid (oil, water, gas). Examples of fluid properties include oil viscosity, oil formation factor ($B_o$), and pressure, temperature, and saturation in each of the gridblocks.

The fluid flow rate calculated by the flow simulation module 131 can be output for each fractured zone. Simulation output 127, which can be stored in database 120, contains a flow rate associated with each fracture intersecting the well. If a single fracture flows through multiple vertical gridblocks, the flow exported for that fracture is the summation of the flow from all of the intersected gridblocks. If multiple fractures intersect a single gridblock, then the flow from that gridblock is divided among those fractures based how much height each fracture has in the gridblock. For example, if a first fracture has three feet in a gridblock and a second fracture has two feet in the same gridblock, then the first fracture will get three-fifths of the flow from that gridblock and the second fracture will get two-fifths of the flow from that gridblock.

Once the simulation output 127 is obtained from flow simulation module 131, fracture adjustment module 133 compares it to the dynamic data in parameter file 123. The fracture lengths in the fracture file 125 are updated by fracture adjustment module 133 based on how the simulated production from each fracture compares to the actual production data, such as data obtained from a production logging tool. If the simulated production flow rate is less than the measured flow rate given by the production data, the modeled fracture size is increased. Similarly, if the simulated production flow rate is greater than the measured flow rate given by the production data, the fracture size is decreased. These adjustments are based on longer fractures typically having higher flow rates than smaller fractures, assuming all other fracture properties are constant. Therefore, the fracture lengths can be updated based upon the following mathematical relationship:

$$\text{len\_new}(i) = \text{len\_old}(i) * \left[\frac{\text{true\_rate}(i)}{\text{sim\_rate}(i)}\right]^{n\_exp} \quad \text{(Equation 3)}$$

where i=1→total number of fractures.

In Equation 3, the exponent, n_exp, can be used to accelerate the match between the simulated production flow rates and the measured flow rates given by the dynamic production data. For example, the exponent can be a value of 1. In another example, the exponent can be increased, such as to a value of 2, so that these values converge faster. Another option for the exponent, is starting at a predetermined increased value, such as 2, and every time the variance increases, cutting the value of the n_exp in half. This can continue until the exponent is equal to a smaller predetermined value, such as ¼. If the mismatch still increases, the history matching routine can be terminated. This option can be useful, as the squared term can cause the parameters to overshoot the correct solution. Once the new lengths are calculated, the fracture file 125 is updated by fracture adjustment module 133.

System 100 can repeat the aforementioned steps of calculating the fluid flow rate with the flow simulation module 131 and perturbing the fracture lengths and updating the fracture file 125 with the fracture adjustment module 133 until the one or more predetermined criterion are satisfied. For example, and as described above, the predetermined criterion could relate to adjusting the exponent value over various time steps and stopping if a mismatch between the simulated production flow rates and the flow rates given by the dynamic production data still increases. If the mismatch increases for a predetermined number of iterations, the exponent, n_exp, is considered to reach its lower limit and the program could stop. By way of another example, the predetermined criterion could be running the simulation for a predetermined number of iterations. This criterion is independent of the exponent value in Equation 3, and simply occurs when the maximum number of iterations is reached.

Another example, is to have system 100 continue the refinement of fracture file 125 until the difference between the simulated production flow rates and the measured flow rates given by the production logging tool data goes below a predetermined convergence tolerance. When this happens, a match is considered to occur and the fractures are considered to be at the appropriate size. This can be mathematically expressed using an objective function, which can be defined as the summation of the absolute value of the difference between the simulated fluid flow rates and measured fluid flow rates for all fractures:

$$\text{obj\_fun} = \sum_{i=1}^{n\_fracs} |\text{sim\_rate}(i) - \text{true\_rate}(i)| \quad \text{(Equation 4)}$$

In some cases, the matched simulated flow rates can lead to fractures sizes that are not fully optimized, as gridblock permeability and fracture size cannot both be constrained while only using the measured fluid flow rates provided from the dynamic production data. For example, flow rates that are produced from a well having a higher permeability and shorter fracture lengths are substantially equal to that of a well having a lower permeability and longer fracture lengths. However, with the use of pressure information, the gridblock permeability can be estimated fairly accurately. One skilled in the art will recognize that the gridblock permeability is not simply the matrix permeability. More accurately, it is a combination of the permeability of the matrix blocks and the permeability of the fractures that are not directly connected to the discrete fracture network in communication with the well. In fractured reservoirs, the gridblock permeability is usually greater than the matrix permeability indicating that these fractures are providing flow potential and should be accounted for.

Permeability adjustment module 135, although not required in system 100, can be utilized to help ensure that the gridblock permeability is the correct order of magnitude. In this case, pressure data available from the field, which can be included in parameter file 123, is used as an additional constraint to improve the history matching process. Permeability adjustment module 135 uses pressure information as an additional constraint to adjust gridblock permeability to the correct order of magnitude. If the wellbore pressure is too low, permeability adjustment module 135 can increase the permeability to help maintain the pressure at higher values. Similarly, if the wellbore pressure is too high, permeability adjustment module 135 can decrease the permeability to help maintain the pressure at lower values. Once the pressure is matched, fracture lengths can be calculated for that permeability. Even if pressure data is not available, the permeability adjustment module 135 can check pressure information to make sure that it is reasonable. This alone may considerably narrow the range of uncertainty on gridblock permeability.

Uncertainty module 137, although not required in system 100, can be utilized to generate a measure of uncertainty for the fracture properties. As mentioned previously with regards to the permeability adjustment module 135, ensuring that the pressure data is reasonable will be helpful in finding a single solution of fracture lengths and gridblock permeability. That single solution, however, is dependent upon other parameters such as the fracture height, permeability, and orientation. One way to account for uncertainty in the fracture lengths is to change or vary some of these other parameters within a reasonable range of possibility. For example, the steps of calculating the fluid flow rate with the flow simulation module 131 and perturbing the fracture lengths and updating the fracture file 125 with the fracture adjustment module 133 can be repeated using the changed parameters to obtain a new simulated fluid flow rate. The fracture lengths from these additional simulation runs will be different from the original simulation runs, and uncertainty module 137 can compute a measure of uncertainty for the fracture length. Uncertainty module 137 can also compute measures of uncertainty for fracture area (length and height), permeability, and orientation.

Uncertainty for fracture area, which is the length multiplied by the height, can be computed by changing either of the parameters of length within a reasonable range of possibility, the parameters of height within a reasonable range of possibility, or a combination thereof. For example, height can be kept constant for each fracture so the size of the fracture is only increased by the length. Here, each fracture can have a different height, but the height remains constant for the entire run. By way of another example, the height can vary proportionally with length so that the size is increased both horizontally and vertically. In some embodiments, the height can be set to vary proportionally with the fracture length up to a user-specified maximum height. One will recognize that the height of a fracture measured in a well is generally a partial height, due to most fractures having at least a small angle relative to the well axis. The taller the fracture, the more likely that the height seen in a wellbore will be a truncated, partial measure of the true height.

The uncertainty for fracture permeability, which can be thought of as the ability of the fracture to flow, is also an important fracture property. Fracture flow information can be input as either fracture permeability or aperture. As discussed previously herein, aperture can be estimated for a fracture from borehole image logs. Using Equation 2, fracture permeability can be calculated based on the estimated aperture. However, both values are somewhat uncertain due to reading the borehole image log and using the simplified relationship.

There is also uncertainty associated with ascertaining the fracture orientation values. In current simulation models, fracture surfaces are typically set parallel to the Z axis of the grid and are locally parallel to the wellbore. The obliquity of the fractures in the X-Y plane, however, is accounted for rigorously. They can align N-S, E-W or any angle in between. Similar to aperture, the orientation of the fractures can be determined from borehole image logs, yet values are still somewhat uncertain.

Example 1

FIG. 6 shows a simple example presented to demonstrate the aforementioned system and method. A well is provided that has an upper and lower fracture zone. Production logging tool data from the well shows a response of 180 barrels per day in the upper fracture zone and a response of 240 barrels per day in the lower fracture zone. To simulate the flow rates for this well model, an initial fracture half length of 350 feet is assigned to each of these fractures. Based on these fracture lengths the simulated well model predicts a flow rate of 210 barrels per day from each zone.

The fracture lengths are then adjusted based on the difference between the simulated flow rates and measured dynamic flow rates using Equation 3. Using a value of one for the n_exp in Equation 3, the fracture length in the upper fracture zone is calculated to a reduced length of 300 feet (180 b/d/210 b/d*350 ft=300 ft). The fracture length in the lower fracture zone is calculated to an increased length of 400 feet (240 b/d/210 b/d*350 ft=400 ft).

After a single iteration of simulation, the updated well model, which has an upper fracture length of 300 feet and a lower fracture length of 400 feet, will not likely match the measured production logging tool flow rates. This is because fractures often influence each other and the flow responses are generally nonlinear. However, simulation of the new updated model will be closer to the measured flow rates compared to the original model. After multiple iterations of updating the fracture lengths, the difference between the simulated flow rates and measured dynamic flow rates should converge. In addition to iterative adjustment to fracture length, optimization of fracture height and aperture can also be performed such that the simulated flow rates better match the measured flow rates.

Example 2

This example demonstrates the system and method disclosed herein and specifically helps illustrate how pressure data can be used to further constrain fracture sizes by providing a more accurate estimate of the gridblock permeability. In addition, this example showcases how the uncertainty range of possible fracture sizes can be ascertained by changing some uncertain parameters and rerunning the routine.

Figure 8:
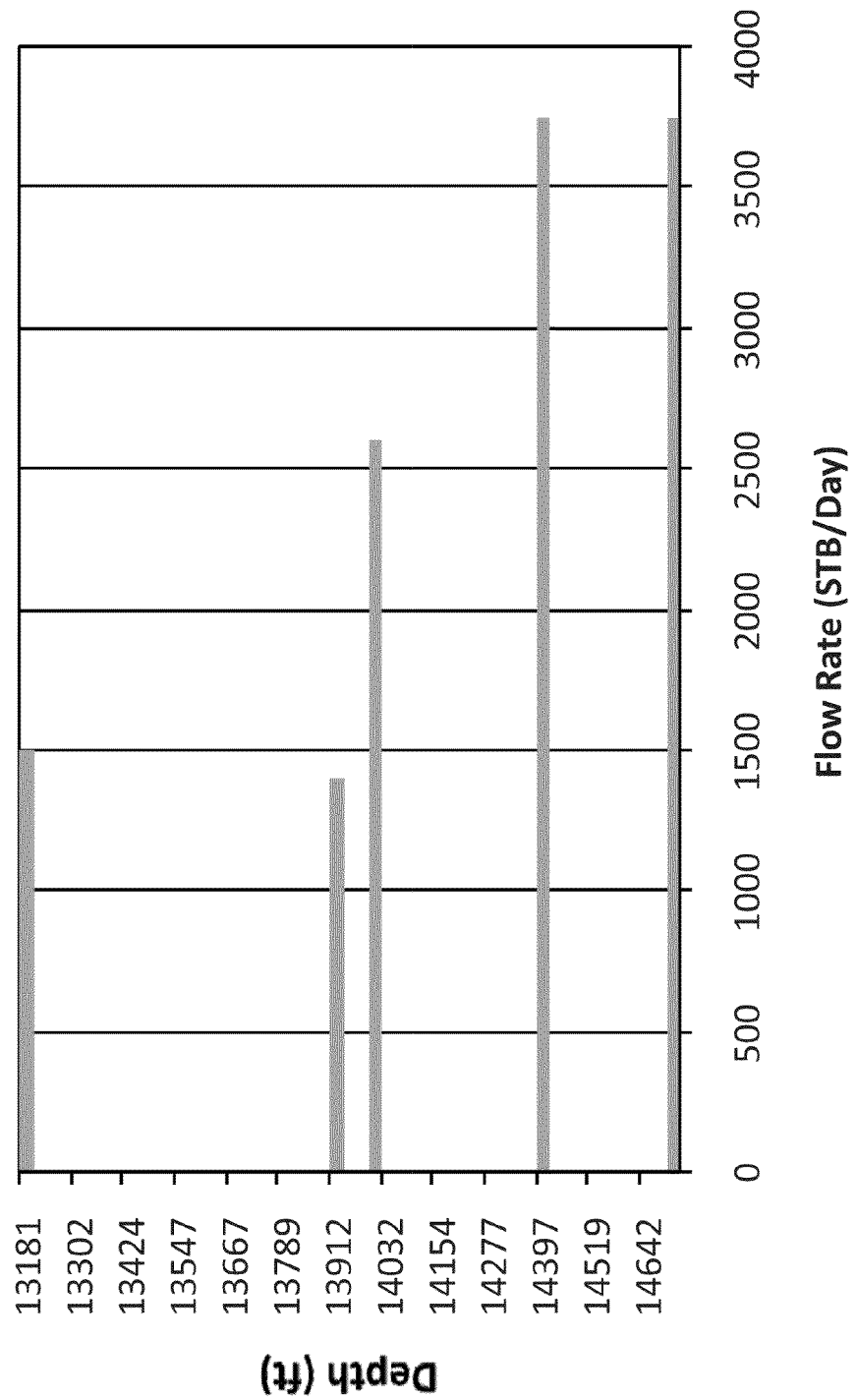
FIG. 8 is a bar chart showing the location and rate of fluid flow into a well, in accordance with aspects of the present invention.

FIG. 8 shows dynamic production logging tool data for an actual well that was recorded about three months after the well was placed online. In FIG. 8, the horizontal bars show the location and quantity of wellbore inflow. In particular, there are five identified fracture zones that show sufficient increased fluid flow.

A Fullbore MicroImager (FMI) electrical resistivity image of the well provides a log of fracture locations, orientations, and apertures, which is shown in the table below:

|   | Depth (ft) | DIP Magnitude (degrees) | Dip Azimuth (degrees) | Aperture (mm) |
|---|---|---|---|---|
|   | 13045 | 309.07 | 79.35 | 20 |
| → | 13182 | 158.33 | 74.27 | 5 |
|   | 13228 | 161.48 | 83.63 | 3 |
|   | 13228 | 81.53 | 78.83 | 1 |
|   | 13262 | 201.95 | 51.05 | 10 |
|   | 13777 | 255.34 | 54.55 | 30 |
|   | 13825 | 091 | 57.46 | 10 |
|   | 13826 | 095 | 64.88 | 20 |
|   | 13843 | 64.53 | 56.73 | 10 |
|   | 13871 | 123 | 59.51 | 2 |
|   | 13879 | 107.05 | 73.5 | 5 |
| → | 13914 | 4.49 | 56.05 | 30 |
|   | 13945 | 120 | 66.26 | 1 |
| → | 14012 | 1.89 | 40.93 | 1500 |
|   | 14048 | 187 | 48.84 | 0 |
|   | 14228 | 300 | 28.2 | 70 |
|   | 14228 | 017 | 50.2 | 0 |
|   | 14249 | 61.72 | 40.1 | 20 |
|   | 14329 | 151 | 29.96 | 1 |
| → | 14419 | 030 | 70 | 10 |
|   | 14589 | 308 | 50.36 | 20 |
|   | 14602 | 339.73 | 32.24 | 25 |
|   | 14651 | 061 | 70.8 | 10 |
|   | 14668 | 131 | 71.29 | 10 |
|   | 14669 | 134 | 66.82 | 10 |
|   | 14683 | 040 | 57.13 | 2 |
| → | 14731 | 129 | 51.7 | 20 |
|   | 14867 | 303 | 69.81 | 30 |
|   | 14900 | 253 | 59.66 | 50 |
|   | 14916 | 324 | 76.28 | 30 |
|   | 14929 | 225 | 87.47 | 10 |

The FMI log shows there are many more fractures in the well compared to the dynamic data from the production logging tool, which is shown in FIG. 8. This is because only a few of the numerous fractures intersecting the well are sufficiently large enough to allow flow at sustained rates. The rows that are highlighted in the FMI log are the fractures that have been correlated with the production logging tool data. Only the data for these five fractures is used in the simulation model to adjust fracture length. This data is summarized in the table below:

| Fracture Number | Depth (feet) | Dip Azimuth (degrees) | Aperture (mm) | Flow Rate (STB/D) |
|---|---|---|---|---|
| 1 | 13182 | 158 | 5 | 1500 |
| 2 | 13914 | 4 | 30 | 1400 |
| 3 | 14012 | 2 | 1500 | 2600 |
| 4 | 14419 | 30 | 10 | 3750 |
| 5 | 14731 | 129 | 20 | 3750 |

The FHI log indicates that fracture #3 has an aperture of 1500 mm or 1.5 meters. While this may seem large for a fracture aperture, this value could represent solution enlargement of fracture walls, creating a cavernous void.

A simulation model of the single-well is generated based on the static and dynamic data. The single-well model has seven blocks in both the x and y directions. Each block of the model is 820 square feet for a total areal dimension is 5,740 feet by 5,740 feet. The model has 40 vertical blocks that are each 50 feet thick and the depth to the top of this model is 13,000 feet, which makes the depth to the bottom of the model 15,000 feet.

Gridblock permeability is homogeneous and equal to 1 mD, in the horizontal direction and 0.001 mD in the vertical direction. The gridblock permeability used in simulation is about one order of magnitude larger than measured matrix permeability (both horizontal and vertical permeabilities), as the flow simulation model is unable to meet the well's flow target rate if the matrix permeability values are used. It is reasonable that the gridblock permeability is greater than the matrix permeability because gridblock permeability is a combination of the matrix permeability and the permeability of the fractures that are not connected directly to the well. These non-connected fractures greatly enhance the gridblock permeability.

A porosity of 6% is used everywhere. The height is set to a constant value of 20 feet for all fractures and all runs. The well model is open to flow at the points where fractures intersect the wellbore, which corresponds to five vertical layers (4, 19, 21, 29, and 35) in the model. Away from the well, however, fractures can vertically intersect multiple gridblocks. This typically occurs when a fracture intersects the wellbore at a point close to a top or bottom gridblock boundary. The wellbore diameter is equal to 0.27 feet, and the total oil flow rate is set to 13,000 stb/d. The time period in which production logging tool data was taken is set to 100 days. The initial lengths are calculated using Equation 3 with an average initial length of 1000 feet.

The simulated flow rates converged within a predetermined tolerance of the dynamic production logging tool data in only 9 iterations using the above inputs, which is relatively quick. The simulation results are summarized in the table below:

| Fracture Number | Total Length (feet) | Simulated Production (STB/D) | True Production (STB/D) | Mismatch |
| --- | --- | --- | --- | --- |
| 1 | 1310 | 1522 | 1500 | 22 |
| 2 | 1328 | 1402 | 1400 | 2 |
| 3 | 3062 | 2607 | 2600 | 7 |
| 4 | 3444 | 3722 | 3750 | 28 |
| 5 | 3484 | 3748 | 3750 | 2 |

The mismatch calculated by Equation 4 for the final well model equals 61. The fracture lengths vary from 1310 feet to 3484 feet. As expected, the fractures with the largest production rates end up with the longest fracture lengths. While these may appear to be very long fractures, recall that use of this method estimates the connected or effective fracture lengths. This could therefore be multiple fractures intersecting each other, and the connected length for the longest fracture network is approximately 3500 feet long.

Figure 9:
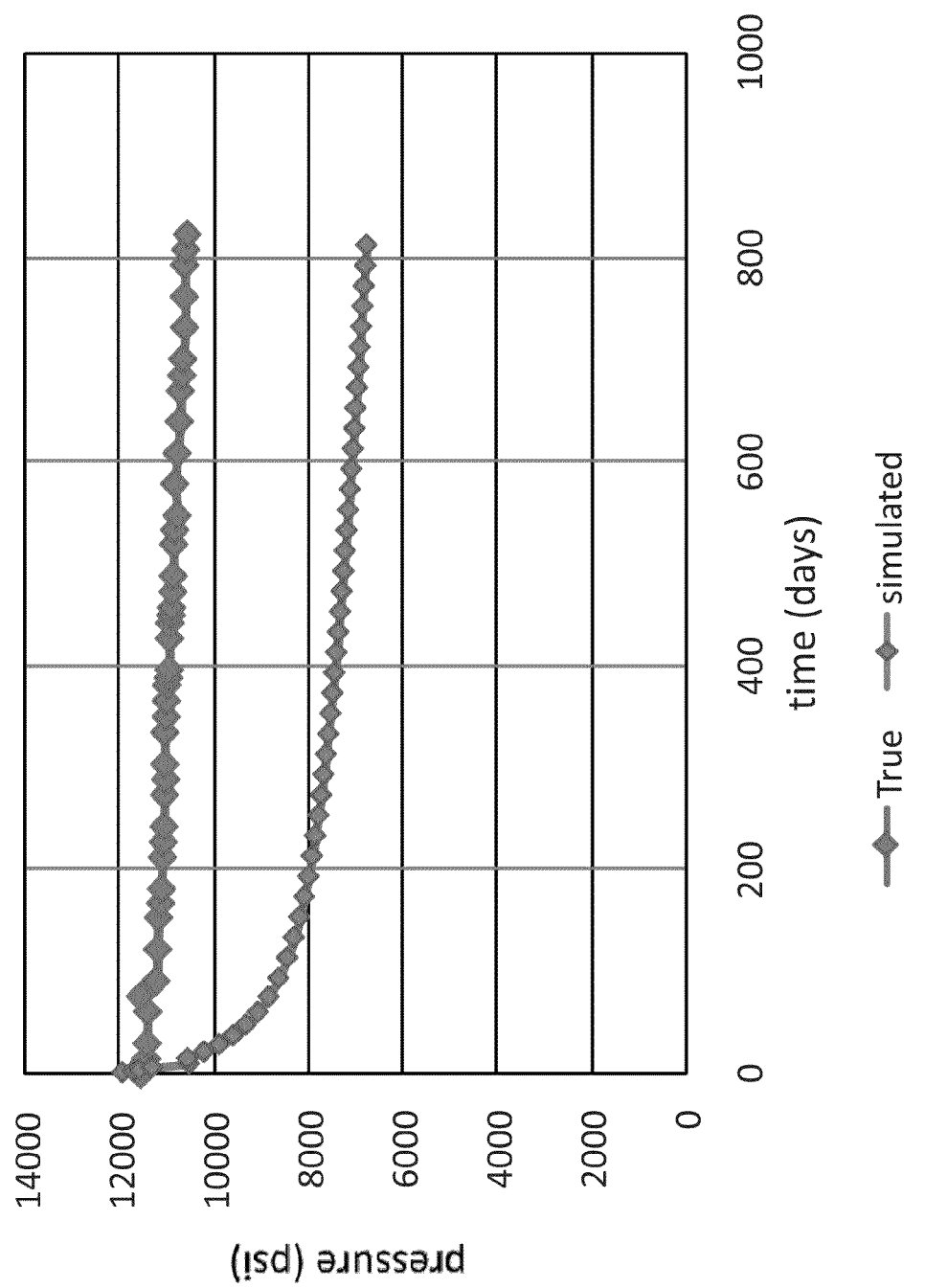
FIG. 9 is a graph comparing measured pressures from a well with simulated pressures of a well model, in accordance with aspects of the present invention.

FIG. 9 compares the simulated pressure response to bottom hole pressure data for this well measured in the field. While the measured fluid flow rate from production logging tool data closely matches the simulated flow rate, the simulated pressure data is much too low compared to the field pressure data. To improve the pressure match, the gridblock permeability is increased. Through a trial and error process that took a few simulation runs, a gridblock horizontal permeability of 10 mD and vertical permeability of 0.01 mD is found that reproduces the measured pressure data.

Figure 10:
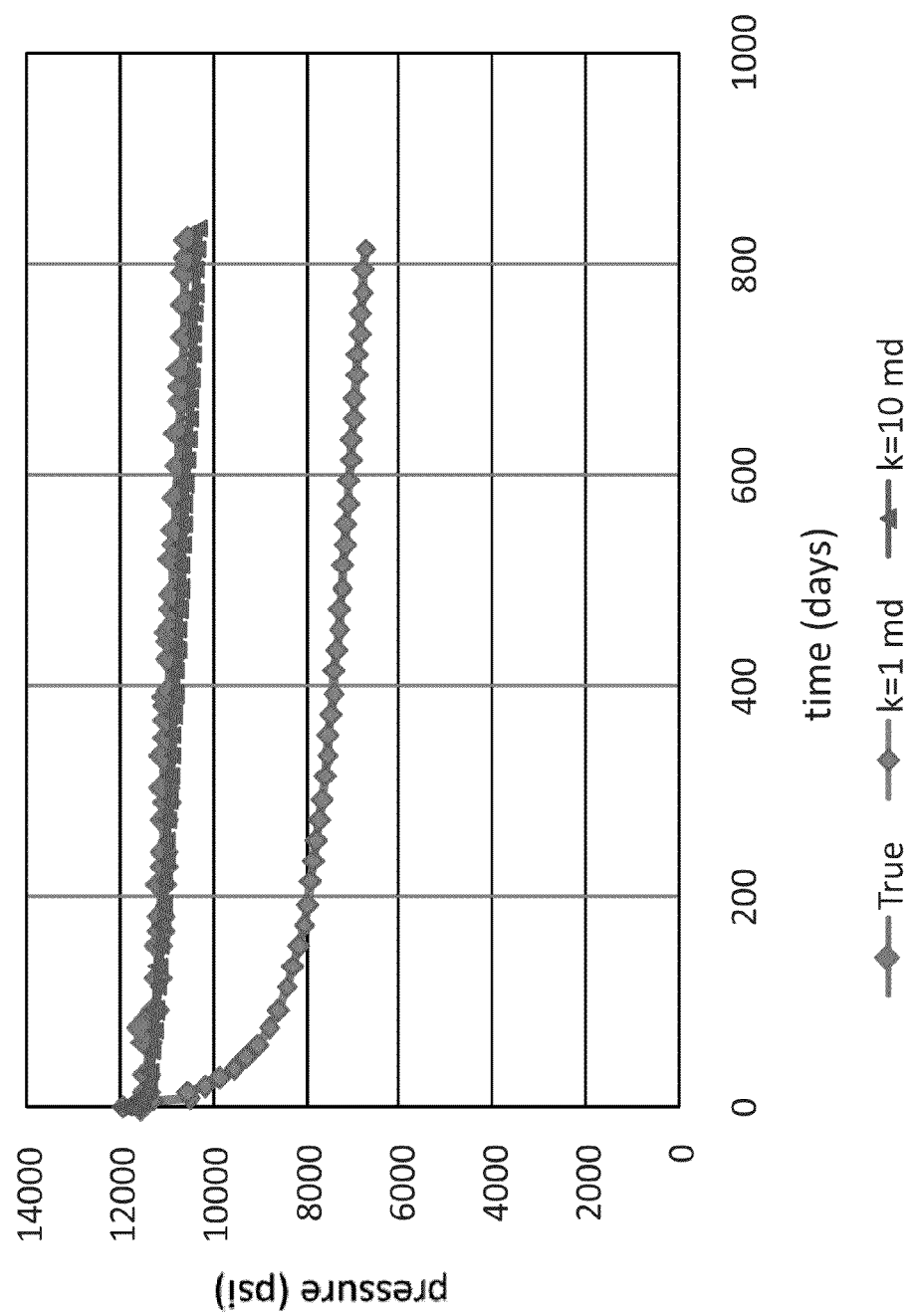
FIG. 10 is a graph comparing measured pressures from a well with simulated pressures of a well model using various gridblock permeabilities, in accordance with aspects of the present invention.

FIG. 10 illustrates the difference between the simulated pressure data verses time for the horizontal gridblock permeability of 1 mD and 10 mD. Unlike the model having a gridblock horizontal permeability 1 mD, the model having a gridblock horizontal permeability of 10 mD closely matches the pressure information measured in the field. Using these pressure-aligned values for permeability, the fracture lengths and flow rates are recalculated. Results are shown in the table below:

| Fracture Number | Total Length (feet) | Simulated Production (STB/D) | True Production (STB/D) | Mismatch |
| --- | --- | --- | --- | --- |
| 1 | 1608 | 1515 | 1500 | 15 |
| 2 | 1284 | 1403 | 1400 | 3 |
| 3 | 3128 | 2603 | 2600 | 3 |
| 4 | 3186 | 3755 | 3750 | 5 |
| 5 | 2900 | 3722 | 3750 | 28 |

The lengths and rates for the new simulation run are slightly different compared to the simulation run that did not match the pressure. Most of the fractures in this run are smaller. Since the gridblock permeability is larger, more flow might be coming into the well from the matrix, so the fractures do not have to be so long to meet the target rates. Fracture 3 is also longer in this run, which might have to do with it being in close proximity to Fracture 2. These two fractures are only 100 feet apart, whereas the other fractures in this well model are over 300 feet apart. There may even be some communication between these two fractures, which results in Fracture 3 having to be longer to meet its flow rate. Fracture 1 is also longer than before, which could be due to the inherent uncertainty in estimating properties with an inversion technique.

While the set of lengths for this model that matches the PLT response and the pressure data, these lengths are by no means a unique set. Five additional runs were completed where other uncertain parameters were changed. Many of the subsequent runs use a non-constant height, so a comparison is made with area (length×height) instead of length alone. In the uncertainty runs, the gridblock permeability of 10 mD, which was previously found to match the field pressure data, was kept constant. This method was repeated while changing uncertain parameters. In particular, Run1 uses the fracture length calculated in the base run previously discussed multiplied by a constant fracture height of 20 feet. Run2 allows heights to vary proportionally with length. The length to height aspect ratio is 40, and the maximum height is set to 20 feet. For Run3 the dip azimuth is changed so that all fractures are 0° (E-W). Run4 combines the changes in Run2 and Run3. For Run5 the fracture permeability is changed to a constant amount of $2\times10^8$ mD, and Run6 combines all of the changes in Run2, Run3 and Run5. The table below shows the results of fracture size for these six different simulation runs.

| Fracture Number | Fracture Area (length × height) ft$^2$ | | | | | |
| --- | --- | --- | --- | --- | --- | --- |
| | Run1 | Run2 | Run3 | Run4 | Run5 | Run6 |
| 1 | 32160 | 34157 | 26275 | 23554 | 26186 | 17433 |
| 2 | 25680 | 21657 | 20471 | 13872 | 21481 | 10886 |
| 3 | 62560 | 63642 | 51540 | 51280 | 57593 | 50484 |
| 4 | 63720 | 64803 | 68645 | 70393 | 64817 | 72018 |
| 5 | 58000 | 59597 | 60364 | 60886 | 60426 | 61310 |

All runs are equally matched to the dynamic production logging tool information and pressure data. There are a range of fractures sizes, but there are also some general trends in all runs. Fracture 4 always has the largest fracture area, and Fracture 2 always has the smallest fracture area. Although Fracture 5 has a much larger flow rate than Fracture 3, they both trade off the spot of being the second largest fracture. Again, this may be because of an interference in some runs between Fracture 3 and Fracture 2 due to their relatively closeness in depth. This may cause Fracture 3 to have to be larger, such that it can meet its target rate.

Example 3

Figure 11:
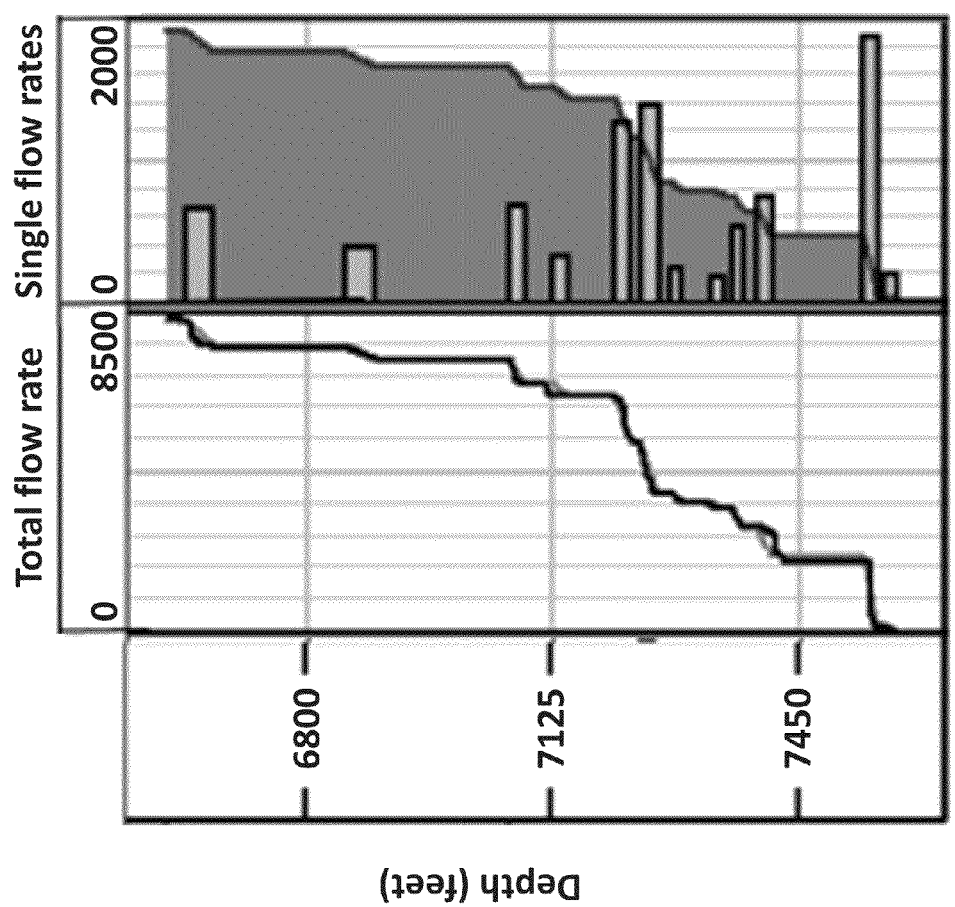
FIG. 11 is a graph showing the location and rate of fluid flow into a well recorded using a production logging tool, in accordance with aspects of the present invention.

FIG. 11 shows production logging tool data for a well in a more geologically complex reservoir. In this example, the model has more fractures, and the porosity and permeability are extracted from a full field model. The PLT data was recorded about 500 days after the well came online. On the right side of the figure, there are a number of horizontal bars that indicate the location of fracture zones at which fluid flow is produced. The lengths of the horizontal bars show how much fluid flow is coming in at each fracture zone. There are twelve zones that show some inflow or increase in fluid flow. However, the production in two of the fracture zones is very little. Since these two fracture zones are in close proximity to more prolific fracture zones, the flow from these two zones will be included with the neighboring more prolific fractured zones. Therefore, the fracture sizes will only be determined in 10 zones during simulation.

Similar to the previous example, there are many more fractures apparent in the FMI log compared to the production logging tool data. Therefore, only data for the ten fractures, which includes correlated fracture zone data from both the PLT and FMI logs, is used in the simulation model. This data is shown in the table below:

| Fracture Number | Fracture Depth (feet) | Dip Azimuth (degree) | Aperture (mm) | Fracture Flow (stb/d) |
|---|---|---|---|---|
| 1 | 6638 | 22 | 10 | 850 |
| 2 | 6867 | 43 | 1 | 425 |
| 3 | 7074 | 213 | 10 | 680 |
| 4 | 7133 | 5 | 10 | 425 |
| 5 | 7215 | 229 | 10 | 1105 |
| 6 | 7260 | 172 | 100 | 1445 |
| 7 | 7310 | 283 | 1 | 170 |
| 8 | 7363 | 304 | 15 | 680 |
| 9 | 7410 | 96 | 70 | 1020 |
| 10 | 7640 | 282 | 20 | 1700 |

The simulation model is a single-well model that has seven blocks in both the x and y directions. Each block is 820 square feet, so the total areal dimension of the model is 5,740 feet by 5,740 feet. There are 22 blocks in the z-direction, and each one is 50 feet for a total of 1,100 vertical feet. The depth to the top of the model is 6,600 feet. The porosity and permeability are extracted from a geologic model for the blocks around the well. The properties were generated with a sequential simulation technique.

Figure 12:
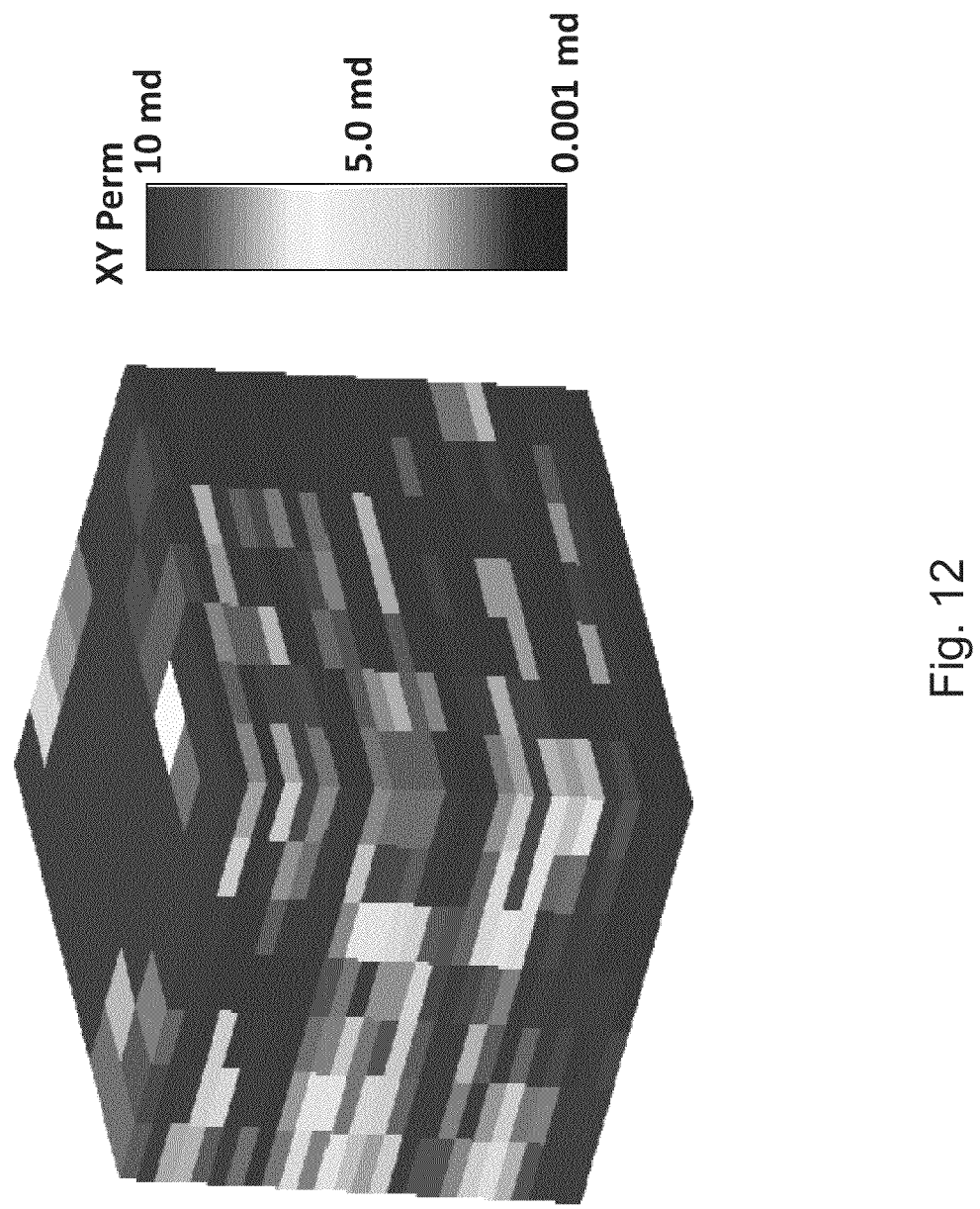
FIG. 12 is a representation of a single well simulation model showing gridblock permeability, in accordance with aspects of the present invention.

FIG. 12 illustrates gridblock permeability for the single-well simulation model, which are approximately an order of magnitude higher than the measured matrix permeability. As discussed previously, the non-connected fractures can greatly enhance gridblock permeability. The vertical permeability is equal to 0.1 times the horizontal permeability, and the porosity is also heterogeneous (not shown) and averages 11%. For the first simulation run, the fracture heights are kept constant at 20 feet for all the fractures. The wellbore radius is 0.27 feet and the total flow is 8500 stb/day. The initial lengths are calculated with Equation 1 using an average length of 200 feet. The convergence tolerance was set at 100.

Figure 13:
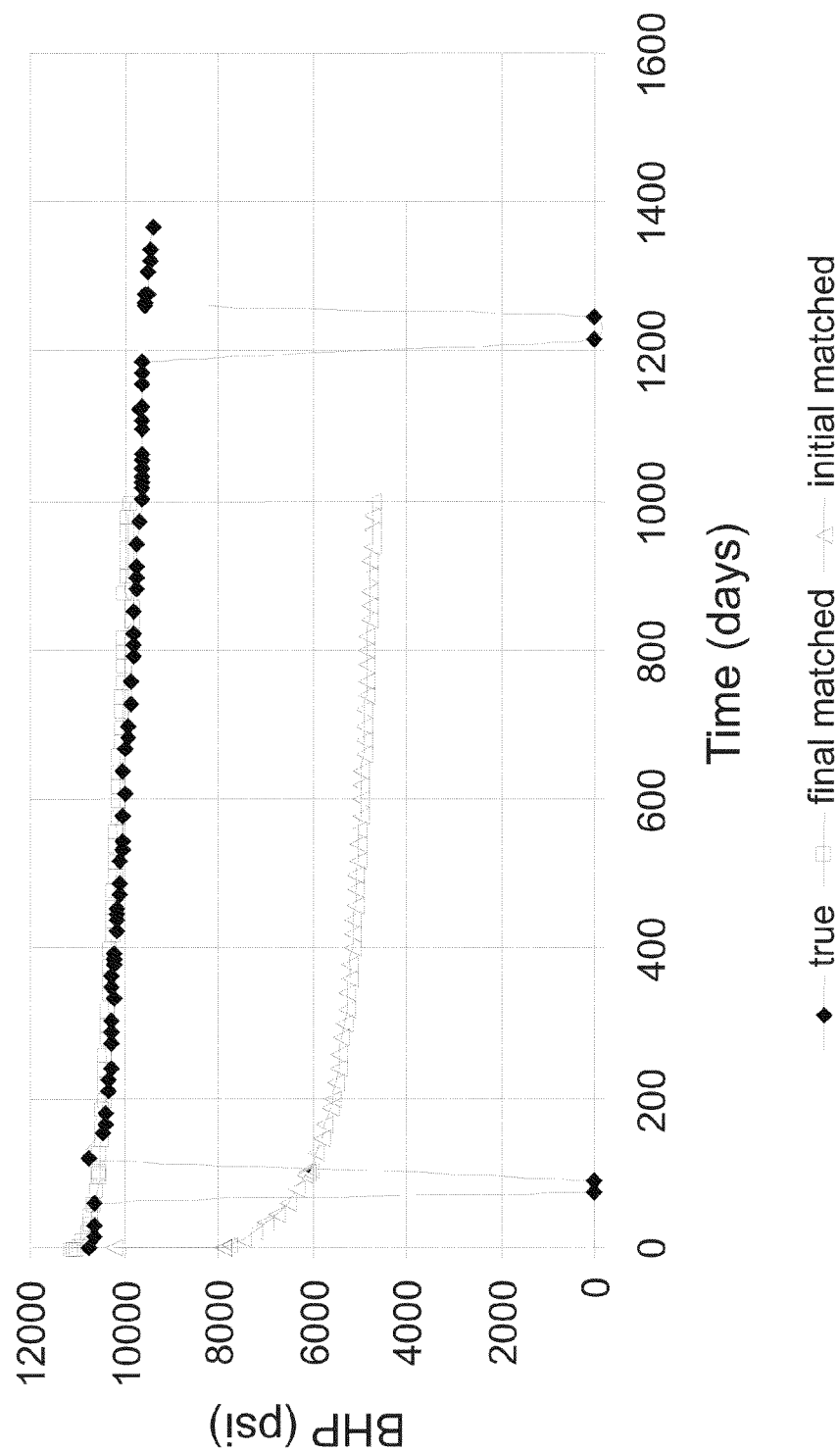
FIG. 13 is a graph comparing measured pressures from a well with simulated pressures of a well model using various gridblock permeability, in accordance with aspects of the present invention.

FIG. 13 shows the pressure data over time for the simulation run. Although the gridblock permeability is greater than the matrix permeability, the initial run is still not able to reproduce the pressure data. Therefore, the gridblock permeability was increased. A permeability multiplier of three was found to create models that matched both the PLT data and the pressure data. The simulation run for this model is also shown in FIG. 13. The fracture lengths and rates are calculated for the pressure-aligned simulation run and are shown in the table below.

| Fracture Number | Total Length (feet) | Simulated Production (stb/d) | True Production (stb/d) | Mismatch |
|---|---|---|---|---|
| 1 | 928 | 844 | 850 | 6 |
| 2 | 152 | 422 | 425 | 3 |
| 3 | 273 | 676 | 680 | 4 |
| 4 | 4 | 425 | 425 | 0 |
| 5 | 1106 | 1120 | 1105 | 15 |
| 6 | 2645 | 1431 | 1445 | 14 |
| 7 | 0 | 192 | 170 | 22 |
| 8 | 352 | 676 | 680 | 4 |
| 9 | 937 | 1019 | 1020 | 1 |
| 10 | 1387 | 1696 | 1700 | 4 |

The fracture lengths vary considerably (from 0 to 2645 feet) for this simulation run, which is somewhat expected since the measured PLT data varies significantly from fracture to fracture (from 170 to 1700 stb/d). Also, the heterogeneous gridblock properties impact the flow from different zones. Note that in addition to providing an estimate of fracture size, insight on the gridblock permeability is also provided. In particular, even though the area of fracture #7 was reduced to zero, the simulated production at this depth exceeded the true production from the PLT log. This is an indication that model permeability at this depth zone is likely too high.

Similar to the previous example, uncertainty of the fracture sizes is calculated by making additional simulation runs. Fracture area is used because some of the fracture heights are not constant. The various runs are created by changing some of the input parameters that are most uncertain. In particular, Run1 corresponds to the fracture lengths calculated above multiplied by a constant height of 20 feet. In Run2, the heights are allowed to vary proportionally with the length. For Run3 the dip azimuth is changed so that all fractures fall into one of three categories (0°, 45°, or 90°) depending on which angle it is closest to. For Run4, the fracture permeability is changed to a constant amount of $1 \times 10^8$ mD, and Run5 combines all of the changes in Run2, Run3 and Run4. The table below has results of fracture area for the five different runs.

| Fracture Number | Fracture Area (length × height) ft² | | | | | |
|---|---|---|---|---|---|---|
| | Run1 | Run2 | Run3 | Run4 | Run5 | Average |
| 1 | 18552 | 17846 | 17422 | 18258 | 17532 | 17922 |
| 2 | 3043 | 2403 | 2464 | 2568 | 2549 | 2605 |
| 3 | 5461 | 4447 | 4554 | 4800 | 4665 | 4785 |
| 4 | 81 | 0 | 89 | 85 | 0 | 51 |
| 5 | 22122 | 21691 | 23832 | 21995 | 23708 | 22670 |
| 6 | 52897 | 50089 | 51772 | 52608 | 52935 | 52060 |
| 7 | 0 | 0 | 1 | 1 | 0 | 0 |
| 8 | 7036 | 5665 | 5813 | 6141 | 6008 | 6133 |
| 9 | 18732 | 17579 | 17881 | 18287 | 18043 | 18104 |
| 10 | 27746 | 24802 | 27034 | 27269 | 28432 | 27056 |

All runs are equally matched to a tolerance of 100 and are visually matched to the pressure data. Fracture 6 consistently is the largest fracture, although it only has the second highest flow rate. This is probably because there are two fractures located within 100 feet of it. These two fractures are competing for flow with Fracture 6, so it has to be longer to achieve its rate. There are no fractures close to the fracture with the highest rate (Fracture 10), so its higher rate is able to be produced with a shorter fracture. For Run2, the fracture sizes tend to be a little shorter than the other runs, which might indicate that height has a bigger impact than length for these fractures. Run4 seems to be very similar to Run1, and therefore, fracture permeability, for this case, may not have as much of an impact as some of the other parameters.

These examples help illustrate the difficulty in characterizing natural fracture properties as currently, there is no way to directly measure the size of a fracture. The method and system disclosed herein present an indirect estimate of fracture properties using data that is readily available for many fractured wells, such as borehole image logs and production logs. The method is straightforward, easy-to-implement, and it can handle wells that intersect multiple fractures. Since the simulated models can be small single-well models, the run times are short, and generally, it only takes a few flow simulations to achieve a reasonable match.

Pressure data can be used to determine gridblock permeability, which is a combination of matrix permeability and the permeability of the fractures that are not connected to a wellbore. The fracture sizes are more constrained if the gridblock permeability is more reliable. Although somewhat constrained, the fracture sizes still have a range of uncertainty because they are indirect estimates. Therefore, by rerunning the routine numerous times, the range of the possible fracture properties can be calculated.

With an improved awareness of fracture properties, one can better understand the interconnectedness of wells and how secondary and tertiary production might behave. Also, the fracture properties, such as size, can be used to create large reservoir models that have large scale connection built into them.

While the invention has been shown in only some of its forms, it should be apparent to those skilled in the art that it is not so limited, but susceptible to various changes without departing from the scope of the invention. For example, while the majority of this application describes naturally fractured wells, the disclosed system and method are also applicable to man-made fractured wells, such as those which are hydraulically fractured.

What is claimed is:

1. A method to simulate fluid flow rates in a subsurface reservoir, the method comprising:
    (a) providing static and dynamic data for a well in a subsurface reservoir that intersects a fracture, the dynamic data including a measured fluid flow rate from the fracture into the well;
    (b) generating a well model using at least one of the static and dynamic data, the well model defining one or more properties of the fracture;
    (c) simulating fluid flow in the well model to obtain a simulated fluid flow rate from the fracture into the well;
    (d) updating the well model by adjusting the one or more properties of the fracture responsive to the simulated fluid flow rate and the measured fluid flow rate;
    (e) simulating the updated well model to obtain an updated simulated fluid flow rate from the fracture into the well; and
    (f) displaying the updated simulated fluid flow rate obtained in step (e).

2. The method of claim 1, further comprising repeating steps (d) and (e) until one or more predetermined criteria are satisfied, the one or more predetermined criteria being selected from a group consisting of the updated simulated fluid flow rate matching the measured fluid flow rate, steps (d) and (e) being repeated a predetermined number of iterations, the updated simulated fluid flow rate being relatively stagnant for a successive number of iterations, and the updated simulated fluid flow rate not converging to within a tolerance of the measured fluid flow rate within a predetermined number of iterations.

3. The method of claim 1, wherein:
    the one or more properties of the fracture comprises a length of the fracture; and
    the adjusting the one or more properties of the fracture responsive to the simulated fluid flow rate and the measured fluid flow rate in step (d) comprises adjusting the length of the fracture by multiplying the length of the fracture by a ratio of the measured flow rate to the simulated flow rate.

4. The method of claim 3, wherein the ratio of the measured flow rate to the simulated flow rate is raised to a power of an exponent.

5. The method of claim 3, wherein:
    the one or more properties of the fracture further comprises a property selected from a group consisting of a height of the fracture and an aperture of the fracture; and
    the adjusting the one or more properties of the fracture responsive to the simulated fluid flow rate and the measured fluid flow rate in step (d) further comprises adjusting the property selected from the group proportional to the length of the fracture.

6. The method of claim 5, wherein:
    the property selected from the group is the height of the fracture; and
    the height of the fracture is adjusted proportional to the length of the fracture up to a predetermined maximum amount.

7. The method of claim 1, wherein the one or more properties of the fracture comprises a height of the fracture.

8. The method of claim 1, wherein the one or more properties of the fracture comprises an aperture of the fracture.

9. The method of claim 1, wherein:
    the well model is associated with a grid defining a plurality of gridblocks; and
    the simulated fluid flow rate from the fracture into the well is calculated by a summation of the fluid flow within each of the gridblocks intersecting the fracture and being adjacent to the well.

10. The method of claim 9, wherein:
    at least one of the gridblocks being adjacent to the well intersects two or more fractures; and
    the fluid flow within each gridblock being adjacent to the well and intersecting the two or more fractures is divided between the two or more fractures based on each of the two or more fractures proportions of height within the gridblock.

11. A method to optimize fracture characteristics within a reservoir model of a subsurface reservoir, the method comprising:
    (a) providing a subsurface reservoir having a fracture intersecting a production well and a reservoir model representative of the subsurface reservoir, the reservoir model defining one or more properties of the fracture intersecting the production well;
    (b) providing dynamic production data from the production well, the dynamic production data including a measured fluid flow rate from the fracture into the production well;

(c) simulating fluid flow in the reservoir model to obtain a simulated fluid flow rate from the fracture into the production well; and (d) optimizing the reservoir model by adjusting the one or more properties of the fracture intersecting the production well responsive to the measured flow rate in step (b) and the simulated fluid flow rate in step (c).

12. The method of claim 11, further comprising:

(e) outputting the reservoir model with the one or more properties of the fracture optimized in step (d) to a user interface device, a monitor, a non-transitory computer readable storage medium, a local computer, or a computer that is part of a network.

13. The method of claim 11, wherein the reservoir model is optimized in step (d) utilizing at least one methodology selected from a group consisting of a genetic algorithm, simulated annealing, and stochastic perturbation methods.

14. The method of claim 11, further comprising:

(e) repeating steps (c) and (d) until one or more predetermined criteria are satisfied, the predetermined criteria being selected from a group consisting of the simulated fluid flow rate matching the measured fluid flow rate, steps (c) and (d) being repeated a predetermined number of iterations, the simulated fluid flow rate being relatively stagnant for a successive number of iterations, and the simulated fluid flow rate not converging to within a tolerance of the measured fluid flow rate within a predetermined number of iterations.

15. A system to optimize fracture characteristics within a well model representative of a production well in a fractured subsurface reservoir, the system comprising:

a computer processor;

a database that stores a well model representative of a production well in a fractured subsurface reservoir and associated well information including simulation input data, parameter data comprising dynamic data including a measured fluid flow rate from a fracture into the production well, fracture data, and simulation output data; and a software program executable on the computer processor, the software program comprising:

a fracture adjustment module which:

generates the fracture data responsive to the parameter data, the fracture data defining one or more properties of the fracture intersecting the production well that are selected from a group consisting of a length of the fracture, a height of the fracture, and an aperture of the fracture;

is adapted to communicate with a flow simulation module of a reservoir simulator such that the flow simulation module uses the parameter data, the fracture data, and the simulation input data to simulate fluid flow in the well model and output the simulation output data including a simulated fluid flow rate from the fracture into the production well; and updates the one or more properties of the fracture intersecting the production well defined by the fracture data based on a ratio of the measured fluid flow rate from the fracture into the well included in the parameter data to the simulated fluid flow rate from the fracture into the production well output in the simulation output data.

16. The system of claim 15, wherein:

the well model defines gridblock permeability; and the software program further comprises a permeability adjustment module which adjusts gridblock permeability within the well model such that a calculated pressure of the simulated fluid flow in the well model is within a predetermined tolerance of a pressure provided in the parameter data.

17. The system of claim 15, wherein the software program further comprises:

an uncertainty module which:

varies parameters within the parameter data;

is adapted to communicate with the flow simulation module of the reservoir simulator to initiate simulation of fluid flow in the well model using the varied parameters within the parameter data and to output the simulation output data indicative of the simulated fluid flow in the well model using the varied parameters within the parameter data; and generates a measure of uncertainty for the varied parameters within the parameter data responsive to the simulation output data indicative of the simulated fluid flow in the well model using the varied parameters within the parameter data.

18. A non-transitory processor readable medium containing a software program used to optimize fracture characteristics within a reservoir model of a subsurface reservoir, the software program comprising:

a fracture adjustment module which:

generates a fracture representation for a reservoir model including one or more properties of a fracture intersecting a production well in a subsurface reservoir;

is adapted to communicate with a flow simulation module of a reservoir simulator such that the flow simulation module uses the fracture representation to simulate fluid flow in the reservoir model and output a simulated fluid flow rate from the fracture into the production well; and optimizes the fracture representation by adjusting the one or more properties of the fracture intersecting the production well responsive to the simulated fluid flow rate from the fracture into the production well.

19. The non-transitory processor readable medium of claim 18, wherein:

the one or more properties of the fracture included in the fracture representation for the reservoir model are selected from a group consisting of a length of the fracture, a height of the fracture, and an aperture of the fracture; and the fracture adjustment module optimizes the fracture representation by adjusting the one or more properties of the fracture based on ratio of a measured rate of fluid flow from the fracture into the production well to the simulated fluid flow rate from the fracture into the production well.

20. The non-transitory processor readable medium of claim 18, wherein:

the reservoir model defines gridblock permeability; and the software program further comprises a permeability adjustment module that adjusts the gridblock permeability within the reservoir model such that a calculated pressure of the simulated fluid flow in the reservoir model is within a predetermined tolerance of a measured pressure of fluid flow from the fracture into the production well.

21. The non-transitory processor readable medium of claim 18, wherein the software program further comprises an uncertainty module which:

varies parameters within the reservoir model;

is adapted to communicate with the flow simulation module of the reservoir simulator to initiate simulation of fluid flow in the reservoir model using the varied parameters within the reservoir model and to output the simulated fluid flow rate from the fracture into the production well using the varied parameters within the reservoir model; and generates a measure of uncertainty for the varied parameters within the reservoir model responsive to the simulated fluid flow rate from the fracture into the production well using the varied parameters within the reservoir model.

\* \* \* \* \*